(12) United States Patent
Wang et al.

(10) Patent No.: US 8,208,527 B2
(45) Date of Patent: Jun. 26, 2012

(54) SCALABLE RECONFIGURABLE CONCURRENT FILTER FOR WIDE-BANDWIDTH COMMUNICATION

(75) Inventors: Yu-Jiu Wang, Pasadena, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1097 days.

(21) Appl. No.: 12/022,624

(22) Filed: Jan. 30, 2008

(65) Prior Publication Data

US 2009/0052597 A1    Feb. 26, 2009

Related U.S. Application Data

(60) Provisional application No. 60/898,244, filed on Jan. 30, 2007.

(51) Int. Cl.
   *H03H 7/30* (2006.01)
   *H03H 7/40* (2006.01)
   *H03K 5/159* (2006.01)

(52) U.S. Cl. ...................................... 375/232

(58) Field of Classification Search ........ 375/222, 375/229, 230, 231, 232, 259, 316, 340, 350, 375/377; 370/210, 289, 318, 335, 342, 480
See application file for complete search history.

(56) References Cited

U.S. PATENT DOCUMENTS

| | | | | |
|---|---|---|---|---|
| 5,737,327 A * | 4/1998 | Ling et al. | .................. | 370/335 |
| 5,754,583 A * | 5/1998 | Eberhardt et al. | ............ | 375/147 |
| 6,163,788 A * | 12/2000 | Chen et al. | ..................... | 708/319 |
| 6,272,168 B1 * | 8/2001 | Lomp et al. | .................... | 375/222 |
| 6,421,379 B1 * | 7/2002 | Vannatta et al. | ............... | 375/229 |
| 6,563,841 B1 * | 5/2003 | Nedic et al. | .................... | 370/480 |
| 6,674,337 B2 | 1/2004 | Hashemi et al. | | |
| 6,917,815 B2 | 7/2005 | Hajimiri et al. | | |
| 2002/0041210 A1 * | 4/2002 | Booth et al. | .................. | 330/149 |
| 2006/0246953 A1 * | 11/2006 | Yamamoto et al. | ........ | 455/562.1 |

OTHER PUBLICATIONS

Wu et al., Integrated Transveral Equalizers in High-Speed Fiber-Optic Systems, IEEE Journal of Solid-State Circuits, 2003, 2131-2137, vol. 38, No. 12.
Rauscher, Microwave Active Filters Based on Transveral and Recursive Principles, IEEE Transactions on Microwave Theroy and Techiques, 1985, 1350-1360, vol. MTT-33, No. 12.

* cited by examiner

*Primary Examiner* — David C. Payne
*Assistant Examiner* — Syed Haider
(74) *Attorney, Agent, or Firm* — Milstein Zhang & Wu LLC; Joseph B. Milstein

(57) ABSTRACT

The invention relates to a reconfigurable continuous FIR filter. The reconfigurable continuous FIR filter includes a delay line including at least two delay elements coupled in cascade. The reconfigurable continuous FIR filter also includes a filter section including at least three gain-phase elements. The filter section also includes a summing circuit having a plurality of inputs at least equal in number to the at least three gain-phase elements and one output. The reconfigurable continuous FIR filter is configured to exhibit a filter transfer function that is reconfigurable in real time. The invention also related to down-converters using the reconfigurable continuous FIR filter. The invention also related to electromagnetic wave receivers using the reconfigurable continuous FIR filter. The invention also relates to a method for reconfigurable real time continuous filtering.

22 Claims, 25 Drawing Sheets

- FIR FILTER IMPULSE RESPONSE:

$$T(\omega) = \sum_N e^{-j \cdot n \cdot \Delta T \cdot \omega} \times A_{w,n} = \sum_N [e^{-j \cdot n \cdot \Delta T \cdot \omega} \times \cos(n \cdot \omega_0 \cdot \Delta T)] = \frac{1}{2} \sum_N [e^{j \cdot n \cdot \Delta T \cdot (\omega_0 - \omega)} + e^{j \cdot n \cdot \Delta T \cdot (\omega_0 - \omega)}]$$

ASSUME COSINE WEIGHTING.

$$T(\omega)|_{max} = T(\omega_0) = \frac{1}{2} N$$

- QUANTIZATION NOISE WITH N B-BITS VGAS:

$$\sigma_N^2 = \frac{N \cdot 2^{-2B}}{12}$$

$$R = \frac{2^{-2B}}{3N}$$

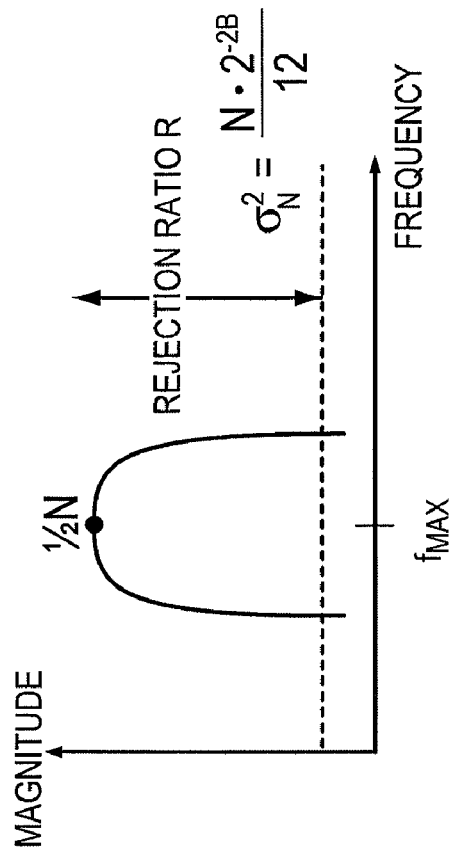

FIG. 15

SCALABLE RECONFIGURABLE CONCURRENT FILTER FOR WIDE-BANDWIDTH COMMUNICATION

CROSS-REFERENCE TO RELATED APPLICATIONS

This application claims priority to and the benefit of copending U.S. provisional patent application Ser. No. 60/898,244, filed Jan. 30, 2007, which application is incorporated herein by reference in its entirety.

STATEMENT REGARDING FEDERALLY FUNDED RESEARCH OR DEVELOPMENT

The invention described herein was made in the performance of work under a U.S. Navy, Office of Naval Research Contract No. AH3.CRAAM.1.RAYTHEON.ONR, and is subject to the provisions of Public Law 96-517 (35 U.S.C. §202) in which the Contractor has elected to retain title.

FIELD OF THE INVENTION

The invention relates in general to an electrical filter and more particularly to an electrical filter that employs a scalable continuous FIR filter topology.

BACKGROUND OF THE INVENTION

At least two unlicensed spectrums have been allocated by the Federal Communication Commission (FCC) for high data-rate wireless communication. One is the Ultrawideband (UWB) standards, with a 7.5 GHz bandwidth, and the other is the 60 GHz standards, with a 7 GHz bandwidth. There has been strong industry interest in both of these spectrums.

One problem or speed "bottleneck" presently precluding full utilization of these wide bandwidths lies in the implementation of the Analog to Digital converter (ADC). A 7 GHz transmission bandwidth means a minimum Nyquist sampling rate of 14 G samples per second to prevent signal from aliasing. ADCs that can sample at such ultra-high speeds are not yet commercially available or even presently contemplated using any economic semiconductor technology. As a result, the industry is using either some variations of pulsed transmission, or only a limited narrow bandwidth for transmission. Neither of these techniques makes full use of the available broad bandwidths.

The concept of a concurrent receiver might help to relieve these issues. As described in U.S. Pat. Nos. 6,674,337 and 6,917,815 to Hashemi et al., an incoming signal is first divided into two narrow bandwidths, each of them accessible to an ADC, so that both are received at the same time (concurrently). The major disadvantages of these inventions are: 1) the two frequencies are pre-selected, and 2) the architecture is not scalable. Also, these inventions are not scalable in terms of the number of outputs and frequency plan.

There is a need for a concurrent filter that lends itself to scalability and that permits real time reconfiguration.

SUMMARY OF THE INVENTION

In one aspect, the invention relates to a reconfigurable continuous FIR filter, including an input terminal configured to accept as input a signal to be filtered, and a first output terminal configured to provide as output a first filtered signal. The reconfigurable continuous FIR filter also includes a delay line including at least two delay elements coupled in cascade and disposed between and in electrical communication with the input terminal and a delay line termination node. The delay line includes at least one node situated between successive delay elements coupled in cascade. The reconfigurable continuous FIR filter also includes a filter section including at least three gain-phase elements having a respective first terminal and a respective second terminal. Each of the at least three gain-phase elements has the respective first terminal coupled to a selected one of the filter input terminal, at least one node situated between successive delay elements coupled in cascade, and the delay line termination node, at least one of the at least three gain-phase elements configurable in real time. The filter section also includes a summing circuit having a plurality of inputs at least equal in number to the at least three gain-phase elements and having one output, a respective one of the plurality of inputs coupled to a respective second terminal of one of the at least three gain-phase elements, the summing circuit output coupled to the first output terminal; wherein the reconfigurable continuous FIR filter is configured to exhibit a filter transfer function that is reconfigurable in real time between the input terminal and the first output terminal.

In one embodiment, the filter transfer function that is reconfigurable in real time includes at least one passband situated between at least two null frequencies.

In another embodiment, the reconfigurable filter is reconfigured in response to a tuning signal applied to at least one of the gain-phase elements.

In yet another embodiment, the reconfigurable continuous FIR filter further includes at least one additional filter section. Each of the at least one additional filter sections has a respective output terminal. Each of the at least one additional filter sections is coupled to the delay line. Each of the at least one additional filter sections is configured to exhibit a reconfigurable filter transfer function that is reconfigurable in real time between the input terminal and the output terminal of the at least one additional filter section.

In yet another embodiment, the at least three gain-phase elements comprise at least three substantially fixed gain real time configurable phase shifters.

In yet another embodiment, the at least three gain-phase elements comprise at least three substantially fixed phase real time configurable variable gain amplifiers.

In yet another embodiment, the at least three gain-phase elements are configured to have a frequency dependent phase characteristic.

In yet another embodiment, the at least three gain-phase elements are configured to provide variable gain.

In yet another embodiment, the reconfigurable electromagnetic wave down-converter includes a reconfigurable continuous FIR filter having at least two output terminals. The reconfigurable electromagnetic wave down-converter also includes at least two mixers, each mixer having at least two respective input terminals and a respective output terminal. One input terminal of each mixer is electrically coupled to a respective output terminal of the reconfigurable continuous FIR filter. A second input terminal of each mixer is electrically coupled to a second source of electromagnetic signals. Each mixer is configured to down-convert an output signal of the reconfigurable continuous FIR filter and configured to provide as output the down-converted signal at the respective output terminal of the mixer.

In yet another embodiment, the reconfigurable electromagnetic wave down-converter further includes an additional reconfigurable continuous FIR filter in electrical communication with at least one output of the at least two mixers.

In yet another embodiment, each of the gain-phase elements further includes a mixer.

In yet another embodiment, each of the mixers further includes a variable gain amplifier.

In yet another embodiment, the reconfigurable continuous FIR filter further includes in electrical communication with at least one output terminal, an additional reconfigurable continuous FIR filter.

In yet another embodiment, a time multiplexed multiple frequency electromagnetic wave receiver, includes a front end including a reconfigurable real time tunable continuous FIR filter according to claim 1, the reconfigurable real time tunable continuous FIR filter having a filter output terminal. The time multiplexed multiple frequency electromagnetic wave receiver also includes a down-converter having a down-converter input in electrical communication with the filter output terminal, and having a down-converter output terminal. The time multiplexed multiple frequency electromagnetic wave receiver also includes a plurality of application circuits in electrical communication with the down-converter output terminal, each application circuit configured to perform a selected application during a selected time multiplexed interval.

In yet another embodiment of the time multiplexed multiple frequency electromagnetic wave receiver, each of the plurality of applications is a selected one of cellular telephone, GPS, wireless LAN, WiFi, WiMax, and Bluetooth.

In yet another embodiment, a parallel channel multiple frequency electromagnetic wave receiver, includes a down-converter, The down-converter is configured to receive a broad band electromagnetic wave signal, and has a plurality of output terminals. The parallel channel multiple frequency electromagnetic wave receiver also includes a plurality of application circuits. Each of the plurality of application circuits is in electrical communication with a selected one of the down-converter output terminals. Each of the plurality of application circuits is configured to receive a frequency band configured to support a selected one of the plurality of applications.

In yet another embodiment of the parallel channel multiple frequency electromagnetic wave receiver, each of the plurality of applications is a selected one of cellular telephone, GPS, wireless LAN, WiFi, WiMax, and Bluetooth.

In yet another embodiment, a parallel channel multiple frequency electromagnetic wave receiver, includes a reconfigurable continuous FIR filter wherein each of said gain-phase elements further comprises a mixer, and having a plurality of output terminals. The parallel channel multiple frequency electromagnetic wave receiver also includes a plurality of application circuits. Each of the plurality of application circuits is in electrical communication with a selected one of the output terminals. Each of the plurality of application circuits is configured to receive a frequency band configured to support a selected one of the plurality of applications.

In yet another embodiment of the parallel channel multiple frequency electromagnetic wave receiver, each of the plurality of applications is a selected one of cellular telephone, GPS, wireless LAN, WiFi, WiMax, and, Bluetooth.

In another aspect, the invention features a method for reconfigurable real time continuous filtering including the steps of: (a) providing an input terminal configured to accept as input a signal to be filtered, and an output terminal configured to provide as output a filtered signal; (b) providing a delay line including at least two delay elements coupled in cascade and disposed between and in electrical communication with the input terminal and a delay line termination node; the delay line including at least one node situated between successive delay elements coupled in cascade; (c) providing at least three gain-phase elements having a respective first terminal and a respective second terminal, each of the at least three gain-phase elements having the respective first terminal coupled to a selected one of the filter input, at least one node situated between successive delay elements coupled in cascade, and the delay line termination node, at least one of the at least three gain-phase elements configured to be tunable in real time; (d) providing a summing circuit having a plurality of inputs at least equal in number to the at least three gain-phase elements and one output, a respective one of the plurality of inputs coupled to a respective second terminal of one of the at least three gain-phase elements, the summing circuit output coupled to the filter output terminal; (e) applying a broadband signal to the input terminal; (f) configuring a transfer function of the by tuning at least one of the at least three gain-phase elements; and (g) delivering at the output terminal an output filtered signal in response to the application of the broadband signal to the input terminal.

In one embodiment, the method includes providing a plurality of structures each including the at least three gain-phase elements as recited in step (c) and wherein step (d) includes providing a plurality of structures each including a summing circuit as recited in step (d), so as to provide a plurality of filter sections.

In another embodiment, the method further includes repeatedly performing steps (f) and (g) in time intervals to deliver a plurality of time division multiplexed filtered signals at the output terminal.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 2b shows a graph of a transfer function plotted in magnitude vs. frequency for the exemplary filter phase shifter settings of FIG. 2a.

FIG. 11b shows a down-converted signal of FIG. 11a.

FIG. 14b shows diagram of an exemplary 3 bit VGA using the unit cell of FIG. 14a.

FIG. 15 shows FIR filter response as related to quantization noise with N-bit VGAs.

DETAILED DESCRIPTION OF THE INVENTION

We describe herein a filter topology suitable for use in a real time configurable concurrent receiver. The inventive filter topologies described herein generally share the common form of a continuous finite impulse response ("FIR") filter. The general form is only remotely related in structure, however, to its well known digital FIR filter counterpart. The inventive continuous FIR filter topology, by contrast, relies entirely on analog technologies, which in typical embodiments, can be fabricated as integrated circuits. While, one of our goals is a real time tunable concurrent radio, our present invention is a real time configurable continuous FIR filter not limited to electromagnetic wave receiver applications.

Our inventive real time configurable continuous FIR filter has at least two important advantages over the prior art. First, our invention is real time tunable. A user of our invention can easily choose or change the operating frequencies at any time during operations as quickly as electronic tuning can be accomplished. Secondly, our invention is scalable. Additional concurrent filter sections and outputs copy filter sections while sharing more costly elements. Overhead costs for additional (concurrent) filter sections are therefore minimal. In the concurrent embodiments achieved by repeating certain filter elements to create additional real time configurable continuous FIR filter sections (scalability), each of the concurrent outputs (such as used to create parallel radio channels) can work independently offering the user great flexibility through simultaneous active radio bandwidths (parallelism).

The detailed description of the various embodiments of the inventive real time configurable continuous FIR filter which follow are broken into three parts. In part I, we described several embodiments of the scalable continuous FIR filter topology. In part II, we give examples of useful integrated structures. In part III we describe an exemplary concurrent electromagnetic wave receiver using the inventive continuous FIR filter.

Figure 1:
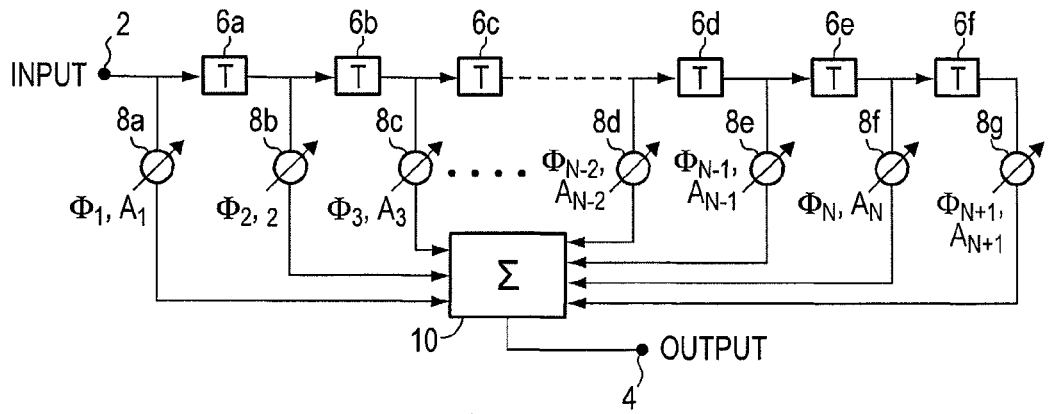
FIG. 1 illustrates one exemplary embodiments of a real time configurable continuous FIR filter according to the invention.

Part I—A Scalable Real Time Tunable Continuous Fir Filter:

FIG. 1 shows one embodiment of a real time configurable continuous FIR filter according to the invention. An input signal at input 2 can be any type of suitable electrical signal. Suitable input signals include voltage, current or power signals. Such input signals can be viewed as linear combinations of many narrow band signals at different carrier frequencies. The input signal is fed into the input port (FIG. 1, input 2).

A plurality of stages of wideband delay filters forms a delay line (delay filters are also referred to herein as delay elements). The delay line input is electrically coupled to input 2. Each of stage of delay filters 6a, 6b, 6c, 6d, 6e, 6f (delay elements), have a characteristic delay time of T seconds. The delay filters are connected in sequence (in cascade). While only six delay filters 6a-6f are shown in FIG. 1, the dashed arrow indicates that as many stages of cascaded delay as desired, can be used. The delay filters can be either passive or active, and can be implemented in any suitable technology, as long as each delay element of the delay line can provide a desired group delay. The number of stages of delay filters (delay elements 6a-6f) can include any integer larger than one.

A plurality of preferably non-dispersive variable gain wideband phase shifters 8a, 8b, 8c, 8d, 8e, 8f, 8g (gain-phase elements) sense the original signal at input 2 and the output of the each delay filters 6a, 6b, 6c, 6d, 6e, 6f. Each phase shifter provides a desired phase shift and desired gain to those signals they sense. In this most basic embodiment, we assume that phase shift remains substantially constant over a desired wideband operating range. While only seven of these phase shifters 8a, 8b, 8c, 8d, 8e, 8f, 8g are shown, as described above, the dashed lines in the FIG. 1 indicate that we can use as many phase shifters 8a-8g as we like in accordance with the desired number of delay filters (as shown by delay elements 6a-6f in FIG. 1). The phase shifters can be either passive or active, and can be implemented in any technology, as long as the phase shifters provide the desired characteristics.

As shown in FIG. 1, each of the outputs of phase shifters 8a-8g is respectively connected to an input of summing circuit 10. The summing circuit 10 senses the outputs from the phase shifters and provides an overall summation of the phase shifter outputs, or a linear scaled version of the summation. The result from the summing circuit 10 is provides an output at the output port, output 4. The summing circuit can be either passive or active, and can be implemented in any technology, as long it provides the desired characteristics.

FIG. 2a, FIG. 2b, FIG. 2c, and FIG. 2d illustrate by reference to an exemplary filter how our invention works. In this series of examples, we use two delay filters 12a and 12b, each delay filter (delay element) providing a ⅓ nanosecond delay, and three variable gain wideband phase shifters 14a, 14b, 14c.

Figure 2A:
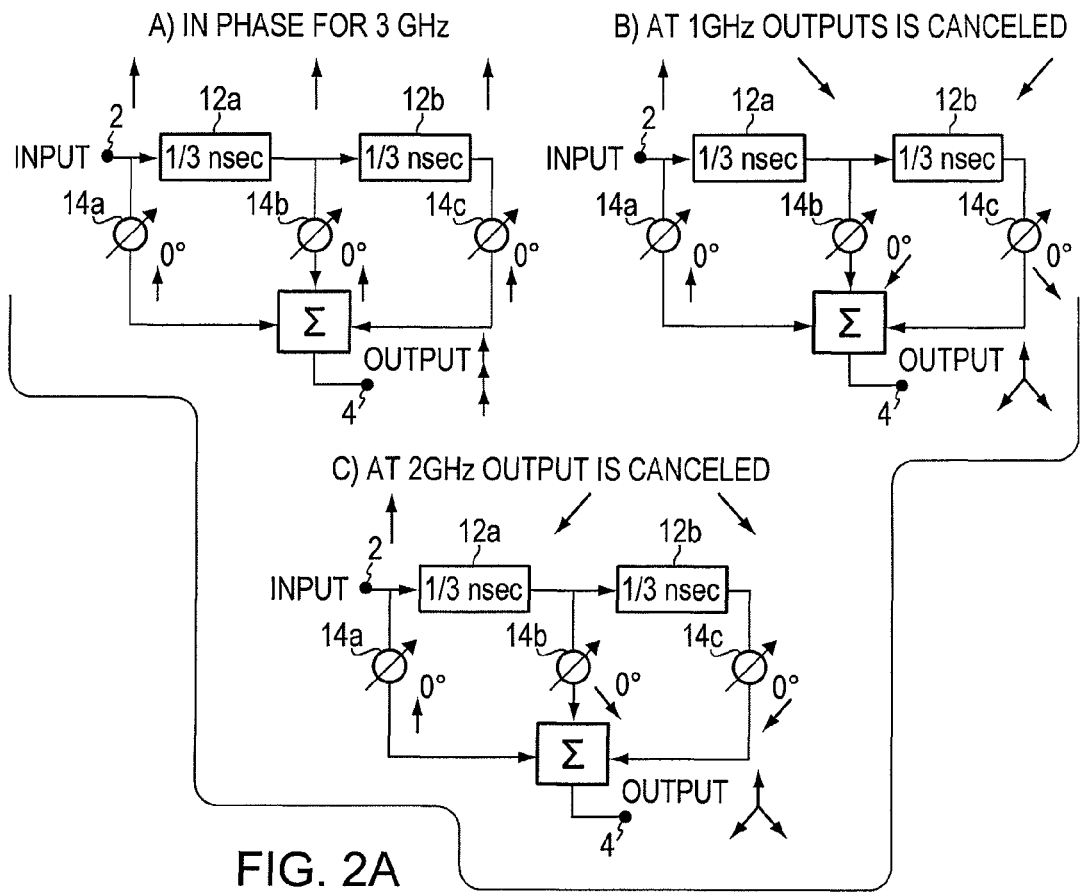
FIG. 2a illustrates the operation of an exemplary embodiment of a continuous FIR filter having 2 delay elements and three phase shifters set to 0 degrees, for 3 GHz, 1 GHz, and 2 GHz input signals.

In FIG. 2a, we intend to provide a transfer function from input 2 to output 4 with a filter passband centered at 3 GHz. In order to do this, we have to set all of our phase shifters to provide a phase shift of 0 degrees. The arrows describe a phasor representation of the signal at different circuit nodes. Referring first to FIG. 2a, A, for a 3 GHz continuous signal input, let the phasor at the input have a phase of 0 degrees. The phasor at the output of the first delay filter 12a will be 0 degrees, since it is ⅓ nanoseconds delayed from input signal (one period of 3 GHz). The phasor at the output from the second delay filter 12b will also be 0 degrees. The first phase shifter 14a shifts the input signal by 0 degrees, so the output of this phase shifter will also be 0 degrees. Similarly, the phase of the outputs of the last two phase shifters 14b, 14c will also be 0 degrees. The summing circuitry sums the output signals from these phase shifters 14a, 14b, 14c, and since they all have the same phase, the output signal strength at the output 4 is tripled. This filter response provides a peak on the filter transfer function at 3 GHz.

Figure 2B:
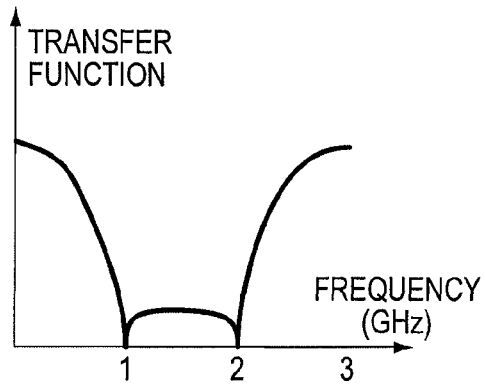

Referring now to FIG. 2a, part B, for an input signal at 1 GHz, if the phase of the input signal is 0 degrees, the output signal phase from first delay filter 12a will be −120 degrees, and the output signal phase from the second delay filter 12b will be +120 degrees. Since all of the phase shifters are set to 0 degrees (0 degree phase shift from phase shifter input to output), the output phases from the phase shifters 14a, 14b, 14c will 0, −120, and +120 degree respectively. Since the outputs from all of the phase shifters in B, FIG. 2a are all out-of-phase at 1 GHz, after the summing circuitry sums the outputs from the phase shifters, they will all cancel each other. This cancellation will provide a null on the transfer function at 1 GHz. Part C of the FIG. 2a shows an example where a 2 GHz input is provided. As in Part B, FIG. 2a, the output phases from these phase shifters are also all out-of-phase. Thus, the output signals will all cancel each other after summing, and this cancellation provides a null on the transfer function at 2 GHz. The overall transfer function from 0 GHz to 3 GHz of the phase shifter setups shown in FIG. 2a, A, B, and C, is shown in FIG. 2b. The transfer function will repeat itself by every 3 GHz after 3 GHz.

Figure 2D:
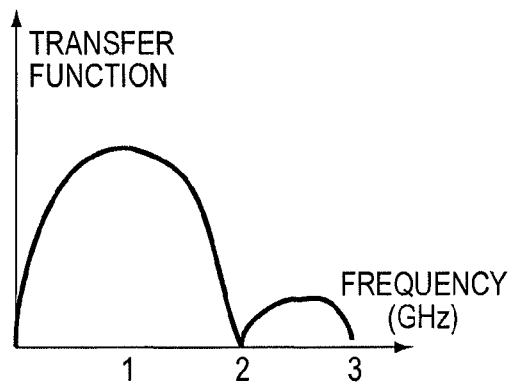
FIG. 2d shows a graph of a transfer function plotted in magnitude vs. frequency for the exemplary filter phase shifter settings of FIG. 2c.
Figure 2C:
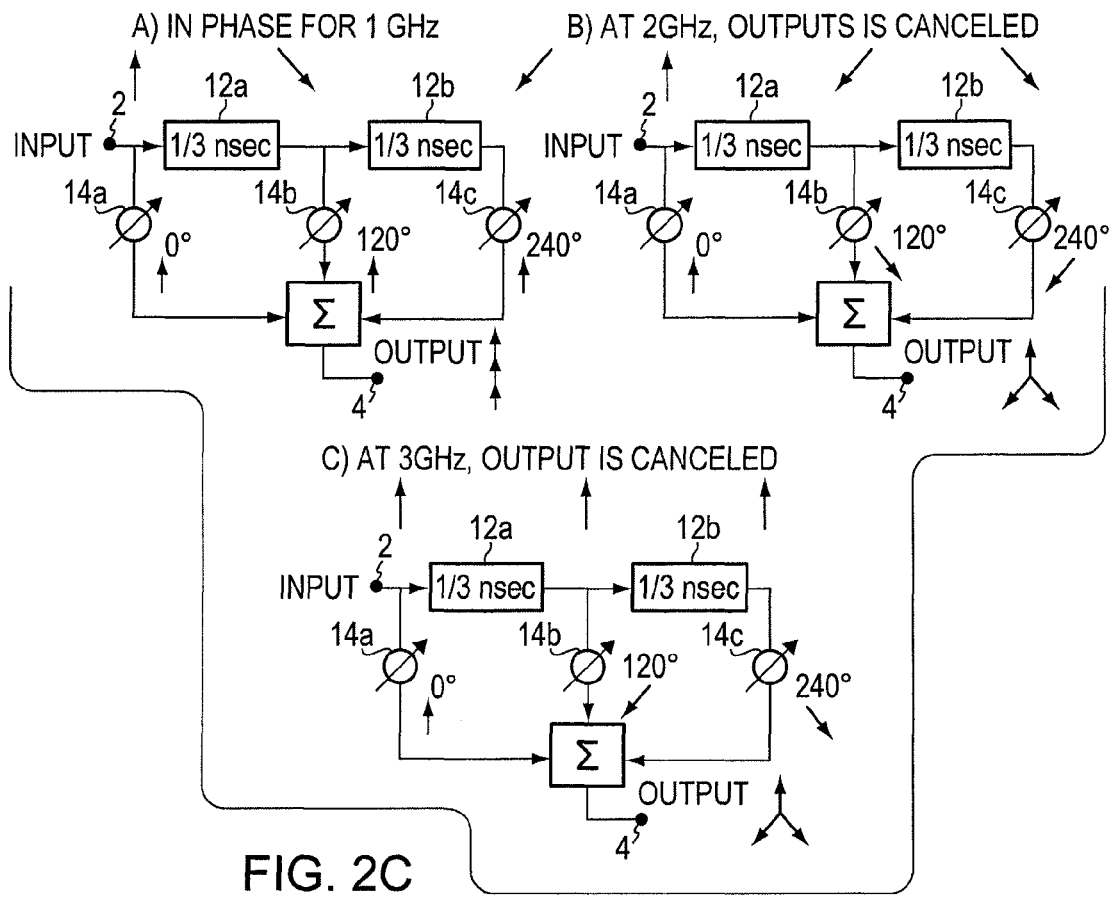
FIG. 2c illustrates the operation of the exemplary filter of FIG. 2a, where the three phase shifters are set to 0, 120, and 240 degrees respectively, for 3 GHz, 1 GHz, and 2 GHz input signals.

To change (reconfigure) the transfer function of this filter to have a passband centered at 1 GHz, we change the setup of the phase shifters to compensate the phase shift introduced by the delay filters at 1 GHz. As shown in FIG. 2c, parts A, B, and C, we select the phase shifts of our phase shifters 14a, 14b, 14c to be 0, +120, and −120 degree respectively. Let the input 1 GHz signal have a 0 degree phase at input 2. The corresponding phases of the signals at the outputs of the delay filters 12a, 12b will then be −120 and +120 degree respectively. According this phase shifter 14a, 14b, 14c setup, the outputs of phase shifters 14a, 14b, 14c will all be 0 degrees, a result that can be viewed as the phase shifters all compensating the phase shift introduced by delay filters 12a and 12b. Since the outputs from phase shifters 14a, 14b, 14c are all in-phase, there is a peak in the filter transfer function at 1 GHz as shown in FIG. 2d.

Turning to FIG. 2c, B, if we now provide a 2 GHz input signal, the signals from the phase shifters 14a, 14b, 14c will be out-of-phase. These out of phase signals will cancel each other after summing, and provide a null in the transfer function at 20 Hz. Thus, for a 3 GHz input signal, as shown in FIG. 2c, part C, signals from the output of phase shifters 14a, 14b, 14c will also be out-of-phase, and provide a null in the transfer function at 30 Hz. The overall transfer function of the setup of FIG. 2c is shown in FIG. 2d. The transfer function will repeat itself by every 3 GHz after 3 GHz.

We now further describe the inventive real time configurable continuous FIR filter of FIG. 1. We show below exemplary methods suitable for designing such filters, given a desired transfer function.

Let the signal at input 2 be s(t), a function of time. The output signal from the first delay filter (6a) will be $s(t)e^{-j \cdot 2\pi \cdot f \cdot T}$, where f is the signal frequency, and the T is the group delay of this filter. The output signal from the n-th delay filter can be written as $s(t)e^{-j \cdot 2\pi \cdot f \cdot n \cdot T}$, where n is integer from 1 to N, and N is the total number of the delay filters. The transfer function of the k-th variable gain wideband phase shifter can be written as $A_k \cdot e^{+j \cdot \phi_k}$, where k is a integer from 1 to N+1, N is the total number of delay filters, $A_k$ is the amplitude weightings, and $\phi_k$ is the phase shift of the phase shifter. Both $A_k$ and $\phi_k$ are programmable, and can be configured to a desired gain or phase. The summing circuitry sums the outputs from phase shifters 8a, 8b, 8c, 8d, 8e, 8f, 8g, and gives the exact sum or a scaled sum of the signals. Thus, the output signal at the output 4 can be written as:

$$\left[ B_{sum} \cdot \sum_{i=0}^{N} A_{i+1} \cdot e^{-j \cdot (2\pi \cdot f \cdot i \cdot T - \phi_{i+1})} \right] \cdot s(t).$$

Here, the constant $B_{sum}$ is the factor of scale of the summing circuitry. Given this mathematical expression, we are interested in how to choose the number (N) of stages of delay filters (the delay elements of the delay line), the group delay (T) of these filters, the weighting and the phase shift of the k-th phase shifters ($A_k$ and $\phi_k$).

To design a reconfigurable filter having a minimum passband 3 dB bandwidth of ΔB in Hertz, the total group delay from these delay filters can by expressed as $$(N+1) \cdot T \geq \frac{1}{\Delta B}.$$

If the input signal has a broad spectrum up to $B_{max}$ in Hertz, the total group delay from these delay filters can by expressed as $$T \leq \frac{1}{B_{max}}.$$

By satisfying these two inequalities, we can determine the number of stages and the group delays of these filters.

For a passband centered at $f_c$, we choose the phase shift of each of the phase shifters 8a, 8b, 8c, 8d, 8e, 8f, 8g to compensate the phase shift introduced by the delay filters 6a, 6b, 6c, 6d, 6e, 6f. The output of the n-th delay filter is $s(t)e^{-j \cdot 2\pi \cdot f_c \cdot n \cdot T}$, and this output is connected to the (n+1)-th phase shifters, exhibiting a transfer function of $A_{n+1} \cdot e^{+j \cdot \phi_{n+1}}$. To compensate the phase shift introduced by the delay filters, we can choose $\phi_{n+1} = 2\pi \cdot f_c \cdot n \cdot T$ in radians. We can choose the amplitude weighting, $A_{n+1}$ to be the same across all of the phase shifters as in the initial design, which means $A_1 = A_2 = \ldots = A_{n+1} = \ldots = A_N = A_{N+1}$. Different sets of amplitude weightings can also be selected to provide some improvement of the overall filter performance, by reducing side lobes at the stop-band frequencies.

Figure 3A:
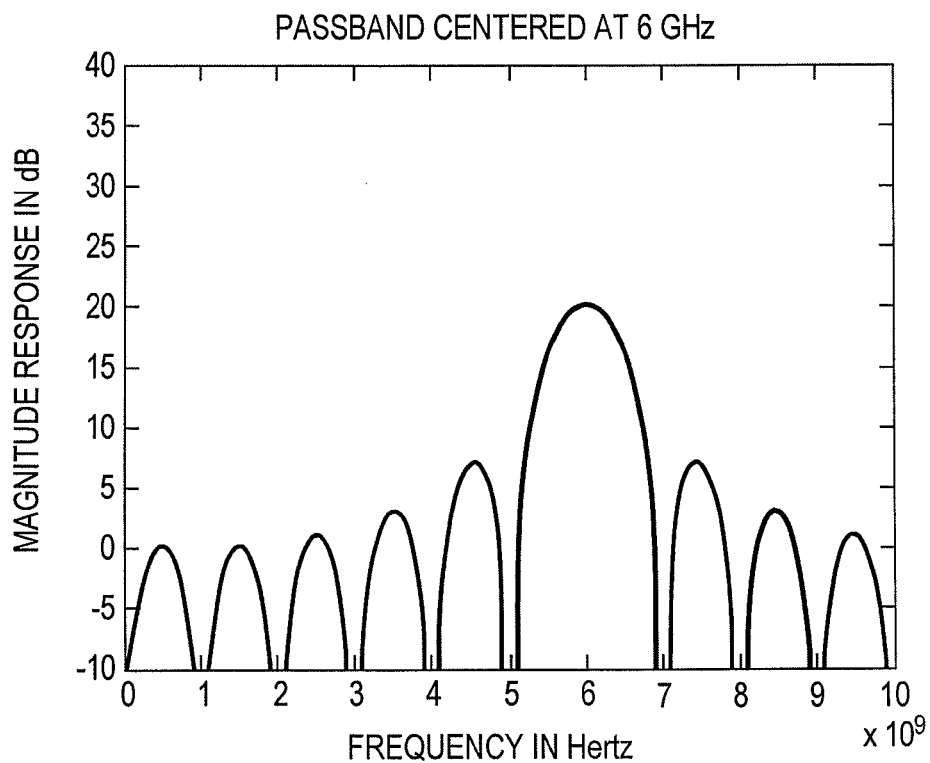
FIG. 3a shows a MATLAB® simulation of the exemplary filter configured for $f_c$=6 GHz.
Figure 3B:
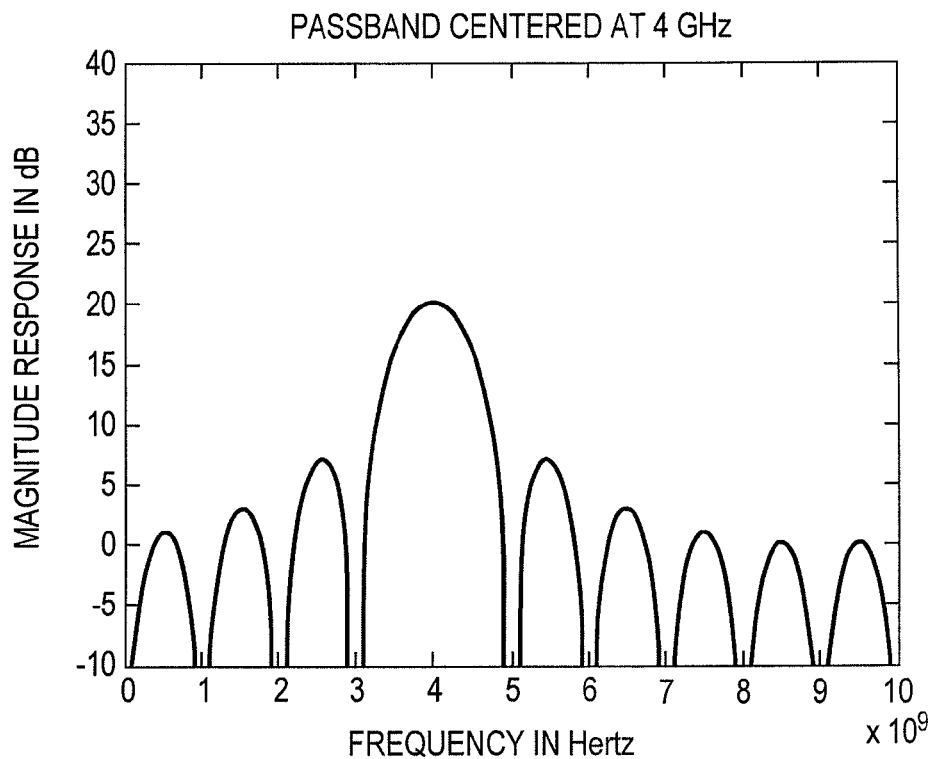
FIG. 3b shows a MATLAB® simulation of the exemplary filter configured for $f_c$=4 GHz.

We now describe the design of an exemplary filter that works from DC to 10 GHz, having a minimum 3 dB bandwidth of 1 GHz. In this example, $B_{max}$ is equal to 10 GHz, and $\Delta B = 1$ GHz. We can choose the group delay (T) of each of these phase shifters to be 0.1 nanoseconds, and the number of stages (N) of phase shifters to be 9. Assume for this example, that we are interested in picking up a signal between 5.5 GHz to 6.5 GHz, therefore $f_c = 6$ GHz, and the phase shift by the k-th phase shifter becomes $\phi_k = 2\pi \cdot (k-1) \cdot 0.6$. For example, the fifth phase shifter should provide a phase shift of $\phi_5 = 2\pi \cdot (5-1) \cdot 0.6 = 2.4 \times 2\pi$ in radians, or equivalently a $0.4 \times 2\pi$ phase shift, since the transfer function of the phase shifter repeats itself every $2\pi$ radian. We can also choose the amplitude weighting of each phase shifter to be 1 in this case. FIG. 3a shows a MATLAB® simulation of the exemplary filter so configured with $f_c = 6$ GHz. If at some later time, we desire to pick up signals between 3.5 GHz and 4.5 GHz, we can reconfigure the phase shift of each of the phase shifters using the method so described. FIG. 3b shows a MATLAB simulation of the filter so reconfigured with $f_c = 4$ GHz.

The design method described above can provide initial choices for the number of stages, group delays of the delay filters (delay elements of the delay line), the phase shift for each of the phase shifters, and amplitude weightings. These initial choices can generally be further fine tuned to achieve a further improvement of one or more of the characteristics of the filter transfer function.

Figure 4:
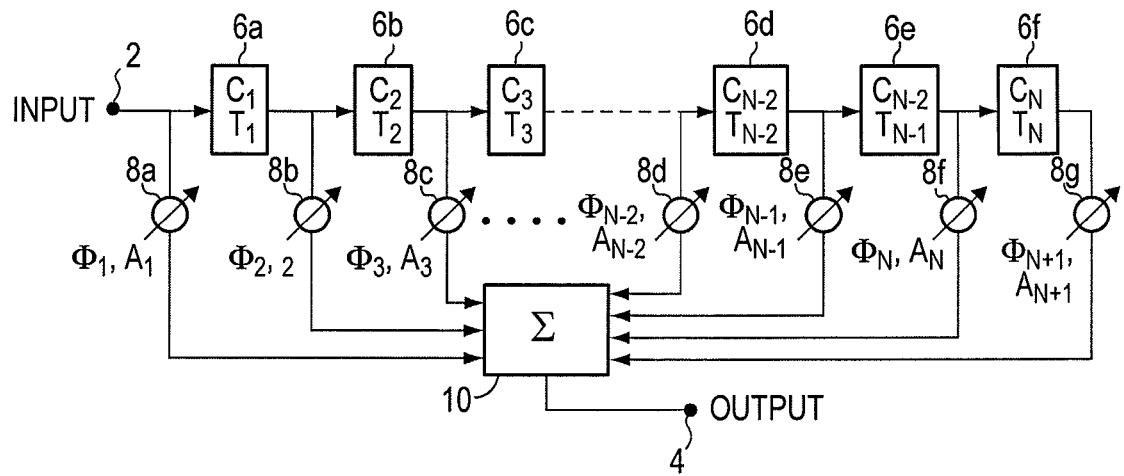
FIG. 4 shows a block diagram of the filter of FIG. 1, highlighting group delays of each delay element.
Figure 5:
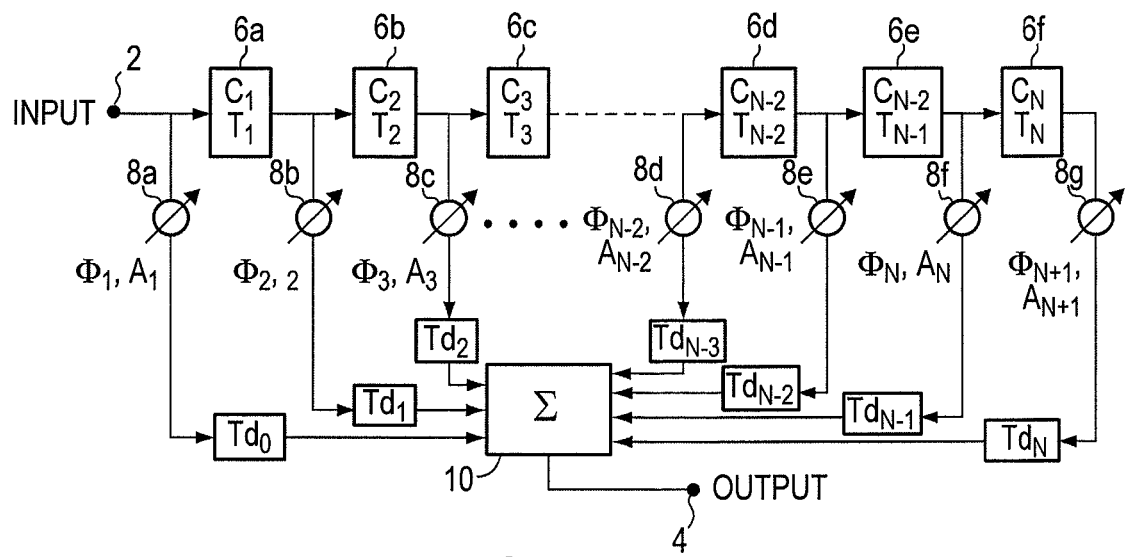
FIG. 5 shows a block diagram of the filter of FIG. 4, showing additional group delays.

Complexions to the ideal case of the invention: In some embodiments, the group delay of the delay filters (delay elements) might not be uniform. As shown in FIG. 4, delay filters 6a, 6b, 6c, 6d, 6e, 6f have group delays of $T_1, T_2, T_3, \ldots, T_{N-2}, T_{N-1}$, and $T_N$ respectively. As shown in FIG. 5, additional group delays can be attributed to the outputs of the phase shifters and to the input of the summing circuitry, for example due to routing. We can define such delays by $T_i \equiv T'_i + T_{di} - T_{d0}$, to create a mathematically equivalent of the filter shown in FIG. 4. Also, there can be gains or losses of each of the delay filters. We can generalize the output of the n-th delay filter to be $$s(f) \cdot \prod_{i=1}^{n} C_i \cdot e^{-j2\pi \cdot f \cdot T_i},$$

where s(f) is the input signal, $C_i$ is the gain of i-th stage, and f is the frequency. If we define $$C_{(first\ n\ stages)} \equiv \prod_{i=1}^{n} C_i, \quad \overline{T} \equiv \frac{1}{N} \cdot \sum_{i=1}^{N} T_i$$

and $$T_{(first\ n\ stages)} \equiv \sum_{i=1}^{n} T_i.$$

We can now re-express the output from the n-th delay filter by the equation $s(f) \cdot C_{(first\ n\ stages)} e^{-j \cdot 2\pi \cdot f \cdot T_{(first\ n\ stages)}}$. Thus, the signal at output 4 can be described by the equation $$B_{sum} \cdot \left\{ \sum_{n=0}^{N} A_{n+1} \cdot C_{(first\ n\ stages)} \cdot e^{-j \cdot [2\pi \cdot f \cdot T_{(first\ n\ stages)} - \phi_{n+1}]} \right\} \cdot s(f).$$

For a reconfigurable filter having a minimum passband 3 dB bandwidth of $\Delta B$ in Hertz, the total group delay from the delay filters can be expressed as $$(N+1) \cdot \overline{T} \geq \frac{1}{\Delta B}.$$

For cases where an input signal has a broader spectrum, up to $B_{max}$ in Hertz, the total group delay from the delay filters can be expressed as $$\overline{T} \leq \frac{1}{B_{max}}.$$

By solving either of these two inequalities as appropriate for a desired bandwidth, we can determine the number of stages and the group delays to be used in the filter design. For a passband centered at $f_c$, we can choose the phase shift of each of these phase shifters 8a, 8b, 8c, 8d, 8e, 8f, 8g to compensate the phase shift introduced by the delay filters 6a, 6b, 6c, 6d, 6e, 6f, which means $\phi_{n+1} = 2\pi \cdot f_c \cdot T_{(first\ n\ stages)}$ in radians. The amplitude weighting now becomes $A_{n+1} \cdot C_{(first\ n\ stages)}$ and we can choose the amplitude weighting to be the same across all other phase shifters as an initial design, which means $A_1 = A_2 \cdot C_{(first\ stage)} = \ldots = A_{n+1} \cdot C_{(first\ n\ stages)} = \ldots = A_N \cdot C_{(first\ N-1\ stages)} = A_{N+1} \cdot C_{(first\ N\ stages)}$. Different sets of amplitude weighting can be tried and studied to provide some improvements to reduce the sidelobes at stop-band frequencies.

Figure 6:
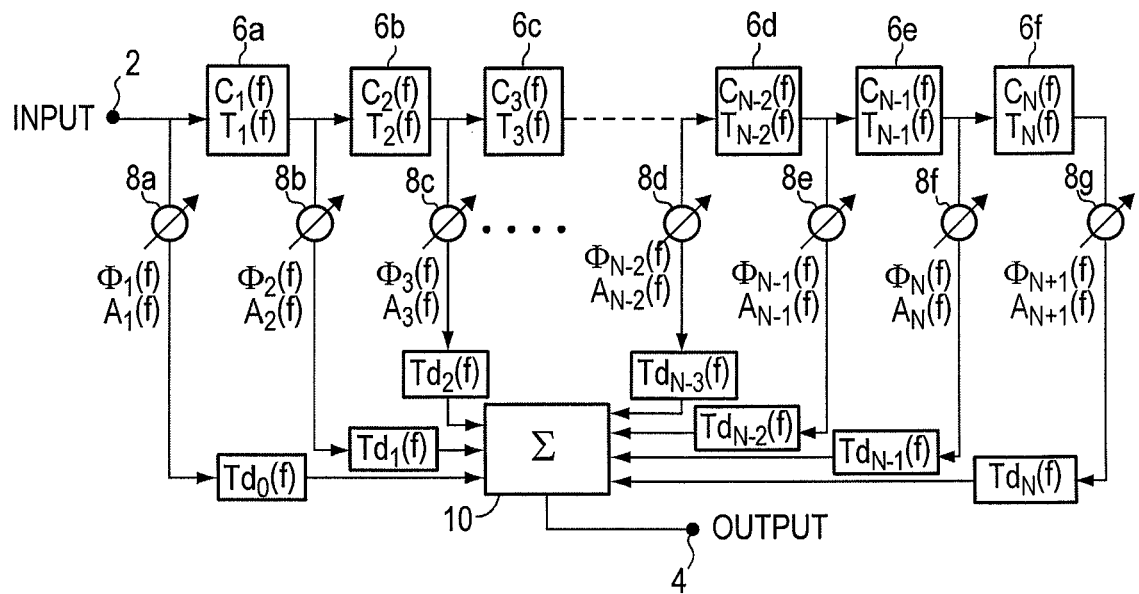
FIG. 6 shows a block diagram of a filter according to the invention where some of the components are dispersive.

As shown in FIG. 6, more complex variances can be extended from the ideas previously discussed with regard to FIG. 4 and FIG. 5, if some of the composite parts are dispersive. For example, if the delay filters (delay elements) are dispersive, their group delays and losses are frequency-dependent. The transfer function of the n-th delay filter can then be expressed as $C_n(f) \cdot e^{-j \cdot 2\pi \cdot f \cdot T'_n(f)}$. If the phase shifters are dispersive, the transfer function of the n-th phase shifter can be expressed as $A_n(f) \cdot e^{-j \cdot \phi_n(f)}$. If the delays from the outputs of the phase shifters to the input of the summing circuitry are dispersive, then the delay of the i-th path can be expressed as $T_{di}(f)$. Also, the summing circuitry can exhibit some dispersive properties, such that the factor of scale $B_{sum}$ is now a function of frequency, or expressed as $B_{sum}(f)$. Similar to the previous examples, we can now define four new parameters: $T_i(f) \equiv T'_i(f) + T_{di}(f) - T_{d0}(f)$, $$C_{(first\ n\ stages)}(f) \equiv \prod_{i=1}^{n} C_i(f), \quad \overline{T}(f) \equiv \frac{1}{N} \cdot \sum_{i=1}^{N} T_i(f)$$

and $$T_{(first\ n\ stages)}(f) \equiv \sum_{i=1}^{n} T_i(f).$$

Figure 7:
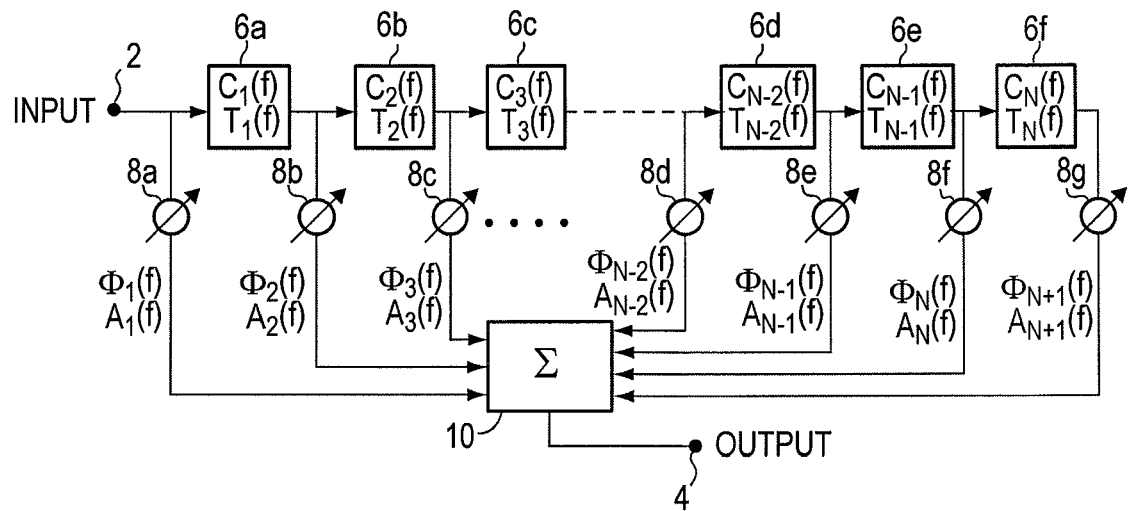
FIG. 7 shows simplified representation of the filter of FIG. 6.

Thus, the circuit in FIG. 6 can be simplified to the equivalent circuit in FIG. 7.

Given an input signal s(f) the output of the filter can be described by the equation $$B_{sum}(f)\cdot\left\{\sum_{n=0}^{N} A_{n+1}(f)\cdot C_{(first\ n\ stages)}(f)\cdot e^{-j\cdot[2\pi\cdot f\cdot T_{(first\ n\ stages)}(f)-\phi_{n+1}(f)]}\right\}\cdot s(f).$$

For a reconfigurable filter having a minimum passband 3 dB bandwidth of ΔB in Hertz, the total group delay from these delay filters can be determined by the equation $$(N+1)\cdot \overline{T}(f_{min}) \geq \frac{1}{\Delta B},$$

where $\overline{T}(f_{min})=\min\{T(f)\}$ for all frequencies f of interest. For an input signal using abroad spectrum, up to $B_{max}$ in Hertz, the total group delay from these delay filters can be determined by the equation $$\overline{T}(f_{min}) \leq \frac{1}{B_{max}}.$$

The number of stages and the group delays can be determined using either of these two inequalities as appropriate for a given desired filter bandwidth. For a passband centered at $f_c$, the phase shift of each of phase shifters 8a, 8b, 8c, 8d, 8e, 8f, 8g can be chosen to compensate for the phase shift introduced by delay filters 6a, 6b, 6c, 6d, 6e, 6f) at $f_c$, which means $\phi_{n+1}(f_c)=2\pi\cdot f_c\cdot T_{(first\ n\ stages)}(f_c)$ in radians. In this case, amplitude weightings become $A_{n+1}(f_c)\cdot C_{(first\ n\ stages)}(f_c)$, and we can choose the amplitude weightings to be the same across all other phase shifters' as the initial design, which means $A_1(f_c)=A_2(f_c)\cdot C_{(first\ stage)}(f_c)=\ldots=A_{n+1}(f_c)\cdot C_{(first\ n\ stages)}(f_c)=\ldots=A_{N+1}(f_c)\cdot C_{(first\ N\ stages)}(f_c)$.

In some cases, the positions of the nulls in the transfer function are important, say at frequencies $f_1, f_2 \ldots, f_K$, where $K \leq N$. Even though the systems are dispersive, we can still find the right combinations of the weights $A_1, A_2 \ldots, A_{N+1}$ by solving the K linear equations of N+1 unknowns:

$$\left\{\sum_{n=0}^{N} A_{n+1}(f_i)\cdot C_{(first\ n\ stages)}(f_i)\cdot e^{-j\cdot[2\pi\cdot f_i\cdot T_{(first\ n\ stages)}(f_i)-\phi_{n+1}(f_i)]}\right\} = 0,$$

for $i=1 \ldots K$.

Since $K \leq N$, the above equations are guaranteed to have a solution. We can use the additional N−K+1 dimensions of freedom to choose more optimal weightings and thus transfer functions to better fit the intended applications.

Figure 8:
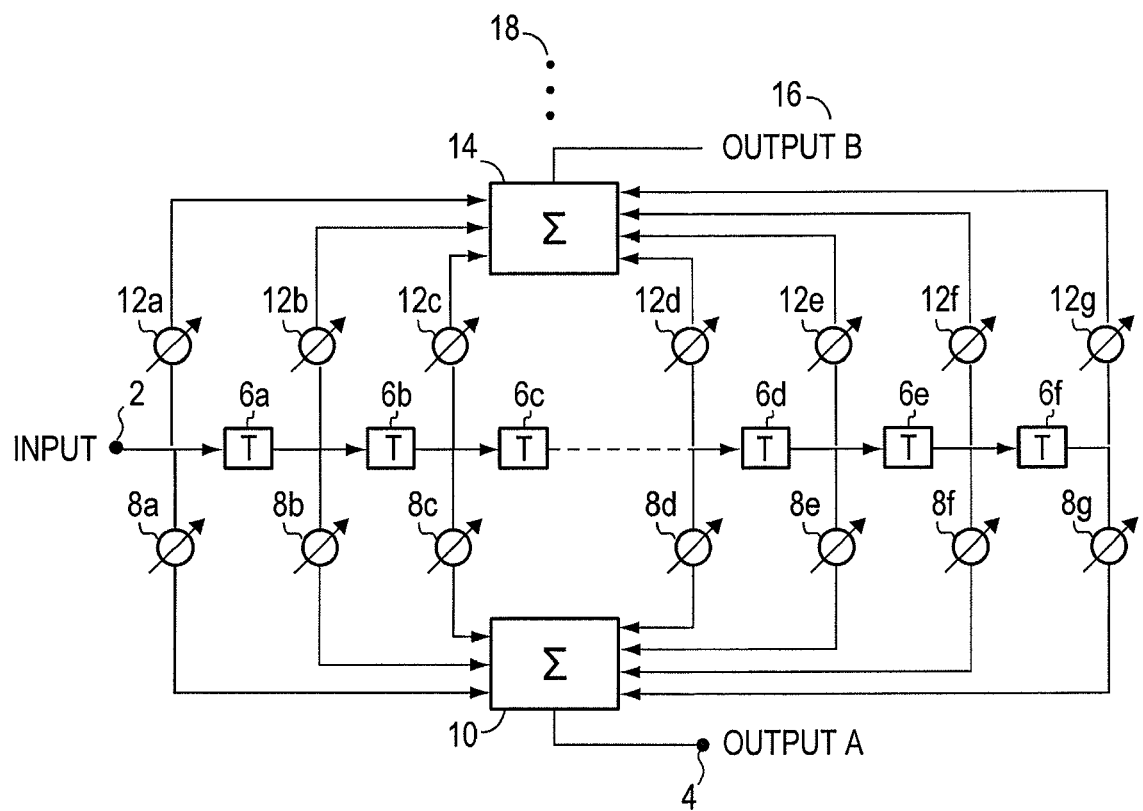
FIG. 8 shows a block diagram of an embodiment of a filter according to the invention having two or more concurrent filter sections.

Concurrent form of filter architecture: The general circuit in FIG. 1 can be extended to have concurrent multiple outputs. As shown in FIG. 8, we can put an additional set of phase shifters 12a, 12b, 12c, 12d, 12e, 12f, 12g, additional summing circuit 14, and additional output b 16 in parallel with original delay filters 6a, 6b, 6c, 6d, 6e, 6f, 6g, phase shifters 8a, 8b, 8c, 8d, 8e, 8f, 8g, and summing circuit 10. Since the new set of the phase shifters 12a, 12b, 12c, 12d, 12e, 12f, 12g can be controlled independently of the other set 8a, 8b, 8c, 8d, 8e, 8f, 8g, the transfer function from the input 2 to output a 4 can be independent of the transfer function from the input 2 to output b 16, and both channels can work simultaneously. We note also that the two channel version shown in FIG. 8, can be easily extended to include more channels by growing the circuits vertically 18, the same way that we added the second channel.

The marginal cost of adding an additional channel (an additional set of phase shifters, summing circuitry, and output) is small, since the most costly filter components are the delay filters 6a, 6b, 6c, 6d, 6e, 6f, 6g, which can be shared by N concurrent filter channels. Parasitic capacitances caused by adding additional channels can be absorbed into the delay filters networks 6a, 6b, 6c, 6d, 6e, 6f, 6g, without deteriorating the quality of the delay filters.

Figure 9:
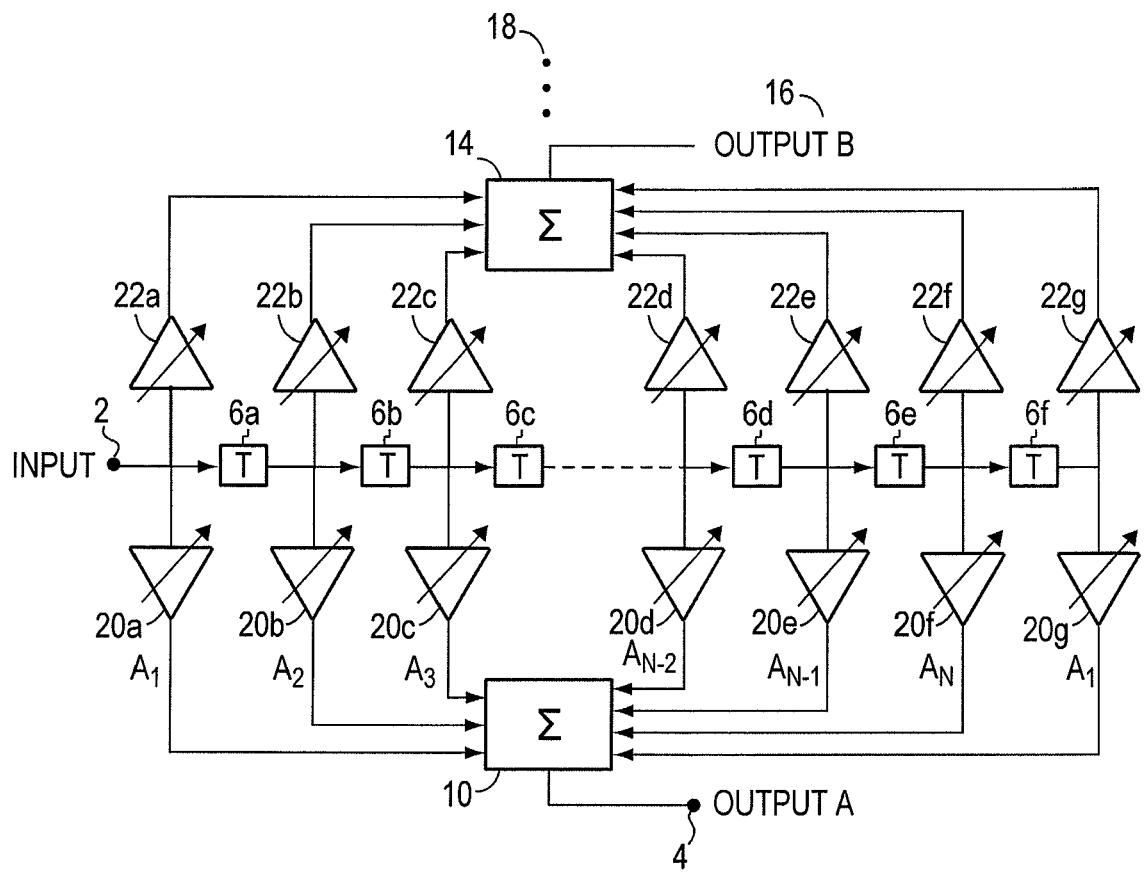
FIG. 9 shows a block diagram of one embodiment of the inventive filter suitable for use at low frequencies.

The inventive filter architecture as adapted for low frequency applications: Due to some practical implementation limits of the phase shifters, some types of phase shifters are less suitable for use at the very lowest frequencies. FIG. 9 shows one embodiment of the inventive filter, especially suitable for phase shifter operation at lower frequencies. The phase shifters 8a, 8b, 8c, 8d, 8e, 8f, 8g, 12a, 12b, 12c, 12d, 12e, 12f, 12g in FIG. 8 have been replaced by variable gain amplifiers 20a, 20b, 20c, 20d, 20e, 20f, 20g, 22a, 22b, 22c, 22d, 22e, 22f, 22g in FIG. 9. Suitable variable gain amplifiers can provide both positive and negative gain. The transfer function from input 2 to the output a 4 can now be described by the equation $$\left[B_{sum}\cdot\sum_{i=0}^{N} A_{i+1}\cdot e^{-j\cdot(2\pi\cdot f\cdot i\cdot T)}\right].$$

If $A_i=D\cdot\cos(2\pi f_c T\cdot i+\phi)$, where $\phi$ can be any number between 0~2π, and D is a constant, then the transfer function becomes $$\left[B_{sum}D\cdot\sum_{i=0}^{N} (e^{j\cdot[2\pi\cdot(f_c-f)\cdot i\cdot T+\varphi]} + e^{-j\cdot[2\pi\cdot(f_c+f)\cdot i\cdot T+\varphi]})\right]$$

with a peak centered at $$f_c \text{ and } \frac{1}{T} - f_c,$$

from $$DC \text{ to } \frac{1}{T} \text{ in Hertz.}$$

To design a reconfigurable VGA based filter having a minimum passband 3 dB bandwidth of ΔB in Hertz, the total group delay from these delay filters can be described by the equation $$(N+1)\cdot T \geq \frac{1}{\Delta B}.$$

For a broader spectrum, up to $B_{max}$ in Hertz, the total group delay from these delay filters can be described by the equation $$T \le \frac{1}{2B_{max}}.$$

The solution to either of these two inequalities can be used as appropriate to determine the number of stages and the group delays of these filters for a given desired filter bandwidth. While, given the same design specification on 3 dB bandwidth ΔB and maximum input signal bandwidth $B_{max}$, the total length of the delays of the delay filters will be the same, a typically realizable architecture as shown in FIG. 9 requires almost two times the number of VGAs as of the number of phase shifters in FIG. 8. However, the cost of the delay filters is determined by the total delay of the network. The total cost of the delay network remains the same. Therefore, the architecture of FIG. 9 still outperforms the previously discussed architecture of FIG. 8 by avoiding the use of phase shifters, as well as being capable of operation from the DC to $B_{max}$.

For a passband centered at $f_c$, we can choose the gain of each of the VGA 20a, 20b, 20c, 20d, 20e, 20f, 20g to be $A_i = D \cdot \cos(2\pi f_c T \cdot i + \phi)$, yielding a transfer peak at frequency $f_c$. Design values can be fine tuned around the calculated values to obtain a more optimal transfer function. Also, the circuit designers can extend the circuits into multiple channels 18, where each additional filter section can work simultaneously and independently of each other. The methods regarding dispersion and dispersive filter components can be used as previously described.

Figure 10:
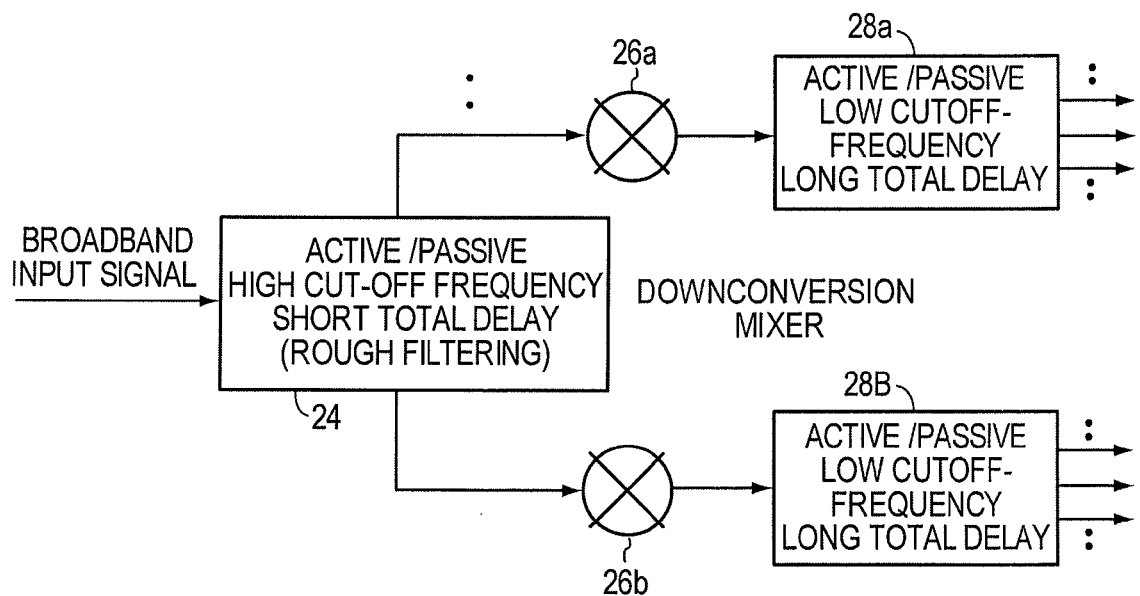
FIG. 10 shows a block diagram of a "divide-and-conquer" filter topology in a down-converter application.

Divide-and-Conquer: The design of a typical delay filter network trades off the maximum filter bandwidth against the total group delay. Also, minimum passband bandwidth is determined by the total group delay of the delay network. Thus, instead of dividing the incoming signal directly to a required passband, as shown in FIG. 10, we can use the method of "divide -of-conquer" by first providing a rough filtering at a first concurrent filter 24, and then down-converting to a lower frequency by use of mixers 26a and 26b. The second stage concurrent filters 28a, 28b can then further separate the down-converted signal into finer passbands. Since the first stage concurrent filter 24 provides only a relatively rough filtering to the incoming broadband signal, the total delay of the delay network can be made smaller. Also, the delay network 24 can have a higher cut-off frequency. Since the total signal bandwidth is reduced by a factor by the first stage, after the down-conversion, the cut-off frequency of the delay network in the second stage filters 28a, 28b can be made small. Thus the total delay length of the overall circuit can be made large, yielding a finer passband.

Figure 11A:
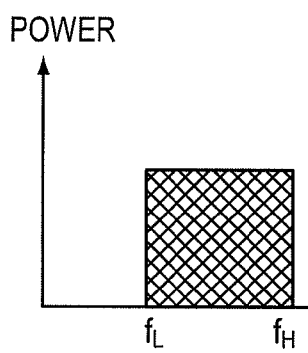
FIG. 11a shows a signal covering a spectrum from frequency $f_L$ to $f_H$.
Figure 11B:
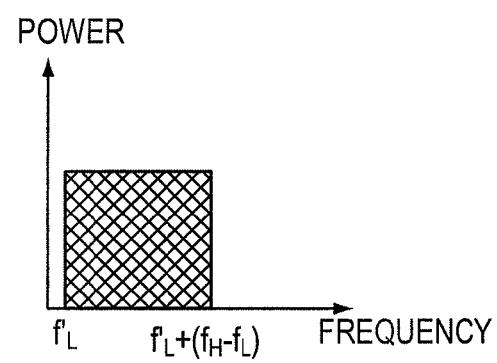

Down-conversion of a high frequency broadband signal before further filtering: If we have an incoming signal covering a spectrum from frequency $f_L$ to $f_H$, (FIG. 11a) it can be helpful to down-convert the incoming signal to a lower frequency spectrum (FIG. 11b) from $f_L'$ to $f_L'+(f_H-f_L)$ before feeding the signal into a concurrent filter. The difference is that, in FIG. 12a, we need a concurrent filter having a delay network with a cut-off frequency higher than $f_H$; however, in FIG. 11b, such a high cut-off frequency is not needed. Therefore, considering the trade-offs in delay network design, we can make a longer delay for the down-converted signal as shown in the FIG. 11b.

Figure 12A:
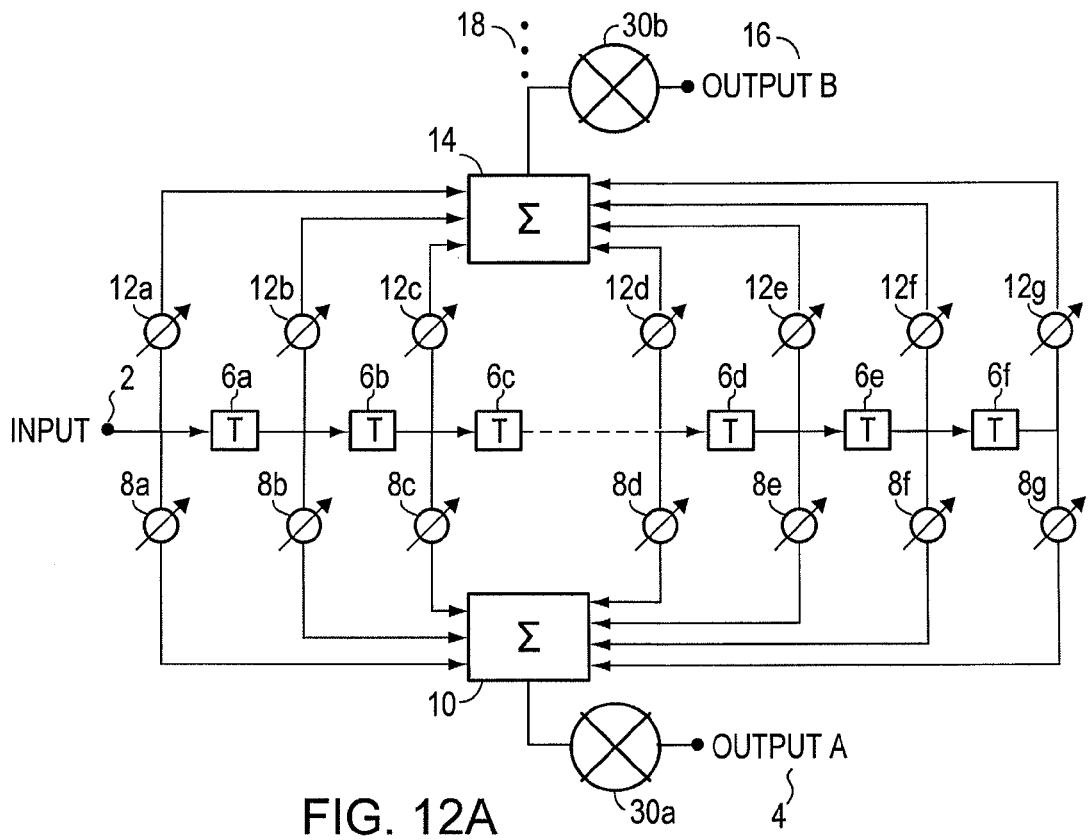
FIG. 12a shows down-conversion mixing performed at the output of concurrent filters.
Figure 12B:
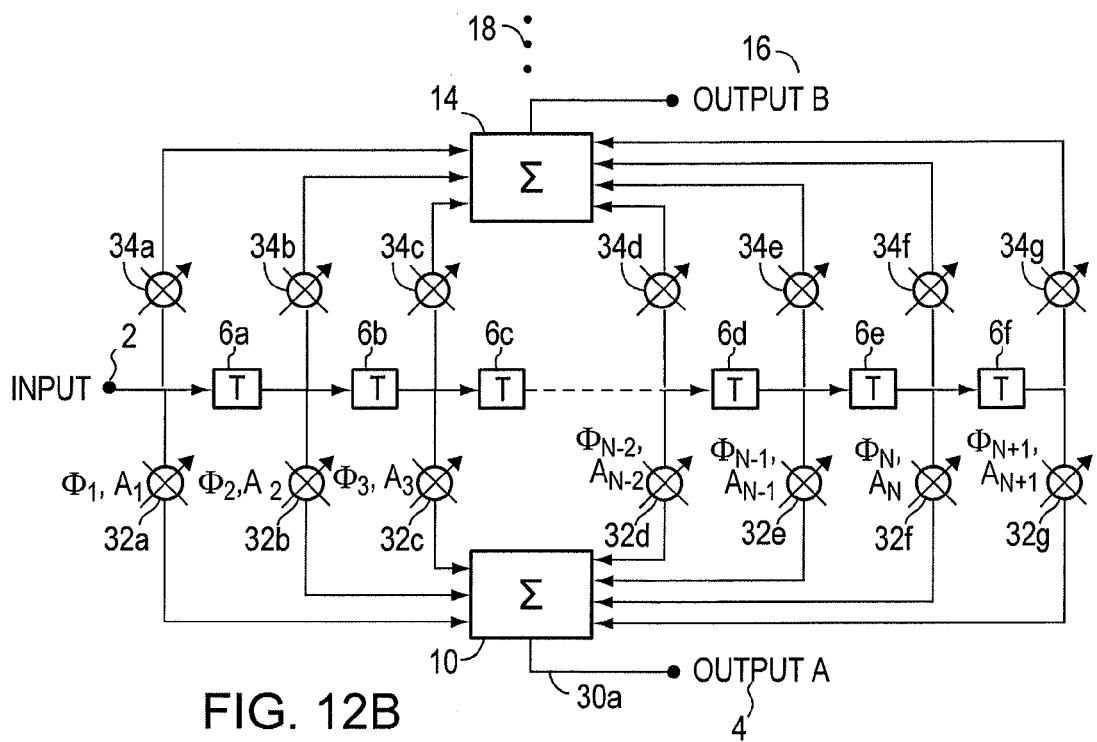
FIG. 12b shows down-conversion mixing performed within a concurrent filter.

LO phase shifting: Many applications of our invention can use down-conversion mixing 30a, 30b at the output of the concurrent filters, as shown in FIG. 12a. As shown in FIG. 12b, by combining usage of mixers 30a, 30b with phase shifters 8a, 8b, 8c, 8d, 8e, 8f, 8g, 12a, 12b, 12c, 12d, 12e, 12f, 12g with a mixer including a phase shifted LO input 32a, 32b, 32c, 32d, 32e, 32f, 32g, 34a, 34b, 34c, 34d, 34e, 34f, 34g, known as the LO-phase shifting method, we can provide equivalent results that are mathematically equivalent to the embodiment of FIG. 12a.

Figure 13A:
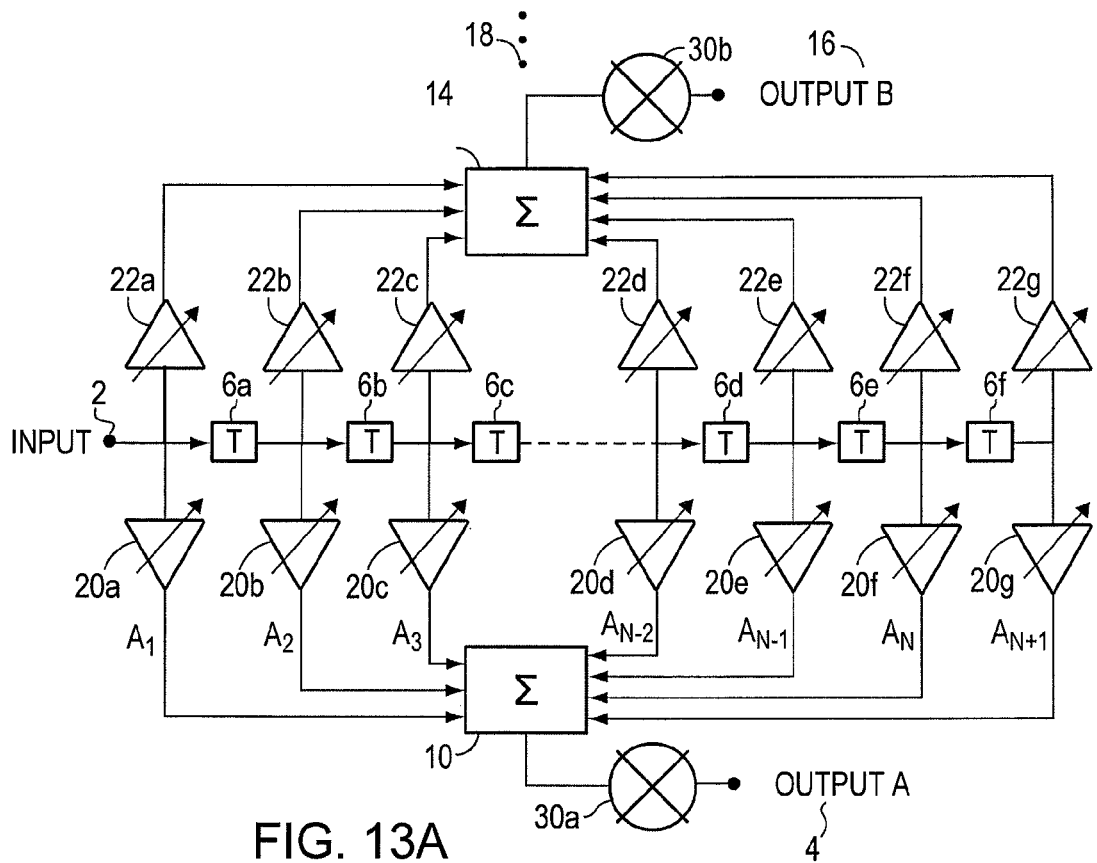
FIG. 13a shows another embodiment of down-conversion mixing performed at the output of concurrent filters.
Figure 13B:
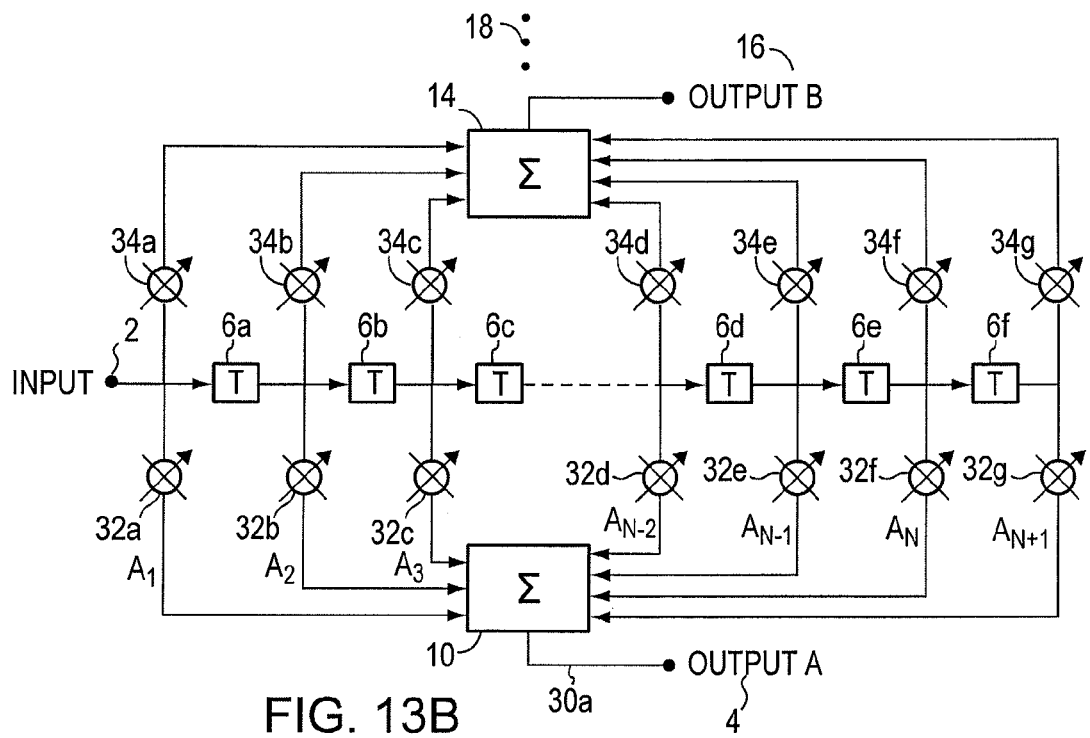
FIG. 13b shows another embodiment where down-conversion mixing is performed within a concurrent filter.

The use of LO real weighting in this invention: Applications of practically realizable forms of our invention can also use down-conversion mixing 30a, 30b at the output of the concurrent filters, as shown in FIG. 13a. FIG. 13b shows another embodiment where the mixers 30a, 30b with the VGA 20a, 20b, 20c, 20d, 20e, 20f, 20g, 22a, 22b, 22c, 22d, 22e, 22f, 22g can be combined into a mixer having a real variable gain 32a, 32b, 32c, 32d, 32e, 32f, 32g, 34a, 34b, 34c, 34d, 34e, 34f, 34g. The embodiment of the inventive filter shown in FIG. 13b can provide an equivalent result and is mathematically equivalent to the embodiment of FIG. 13a.

It should be noted that in several diagrams herein, we show only a main signal path through each mixer for simplicity and to emphasize the main signal paths. It is understood that anytime a mixer is shown in this simplified form, either within the mixer block, or associated with each mixer and not shown in the figures, is a second signal source that is mixed with a mixer input signal to generate a mixer output signal. Typically the second signal source (generally omitted herein for simplicity) is a local oscillator ("LO") signal. Note also, that it is unimportant to the invention whether a second signal source is present at every mixer, or if there is a common LO signal shared by a plurality of mixers, such as by an LO signal bus.

Figure 14A:
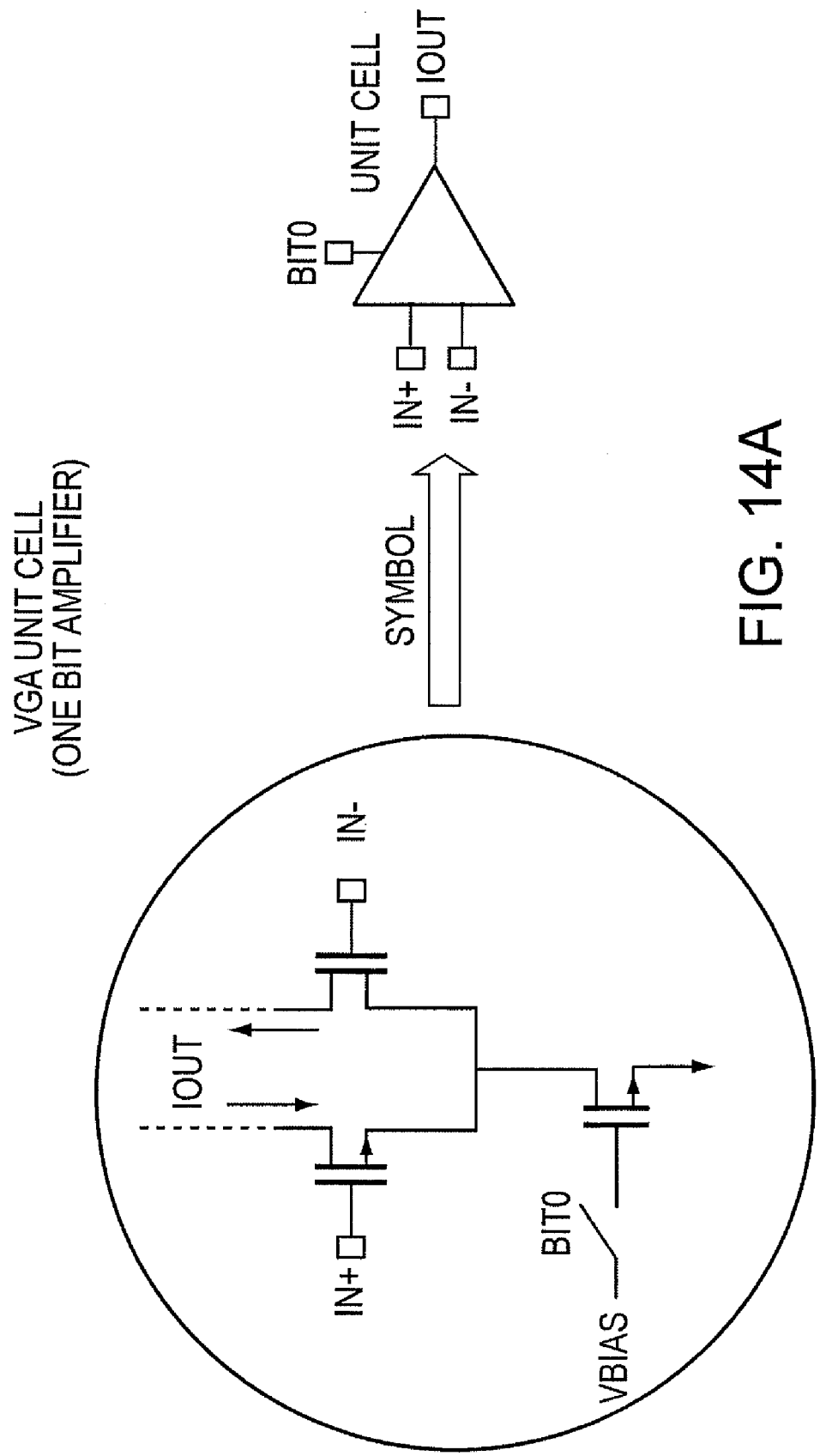
FIG. 14a shows diagram of an exemplary VGA cell.
Figure 14B:
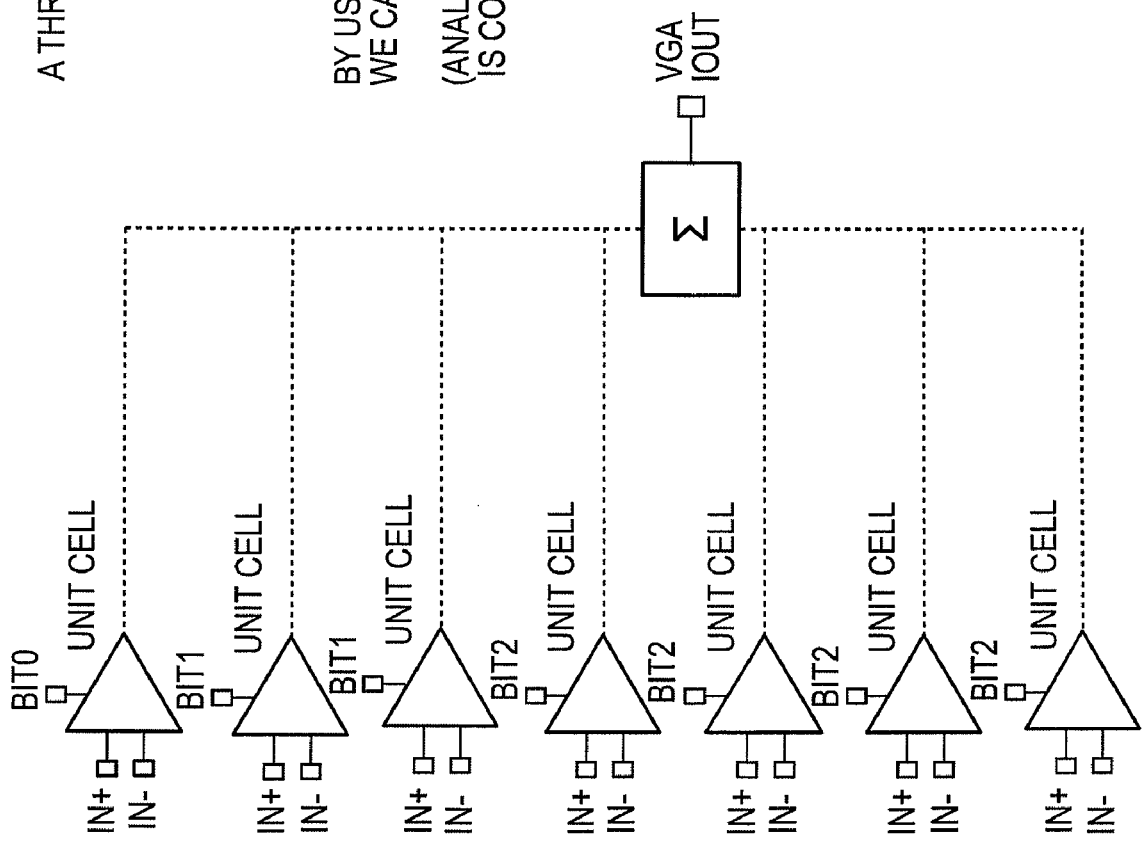
Figure 16:
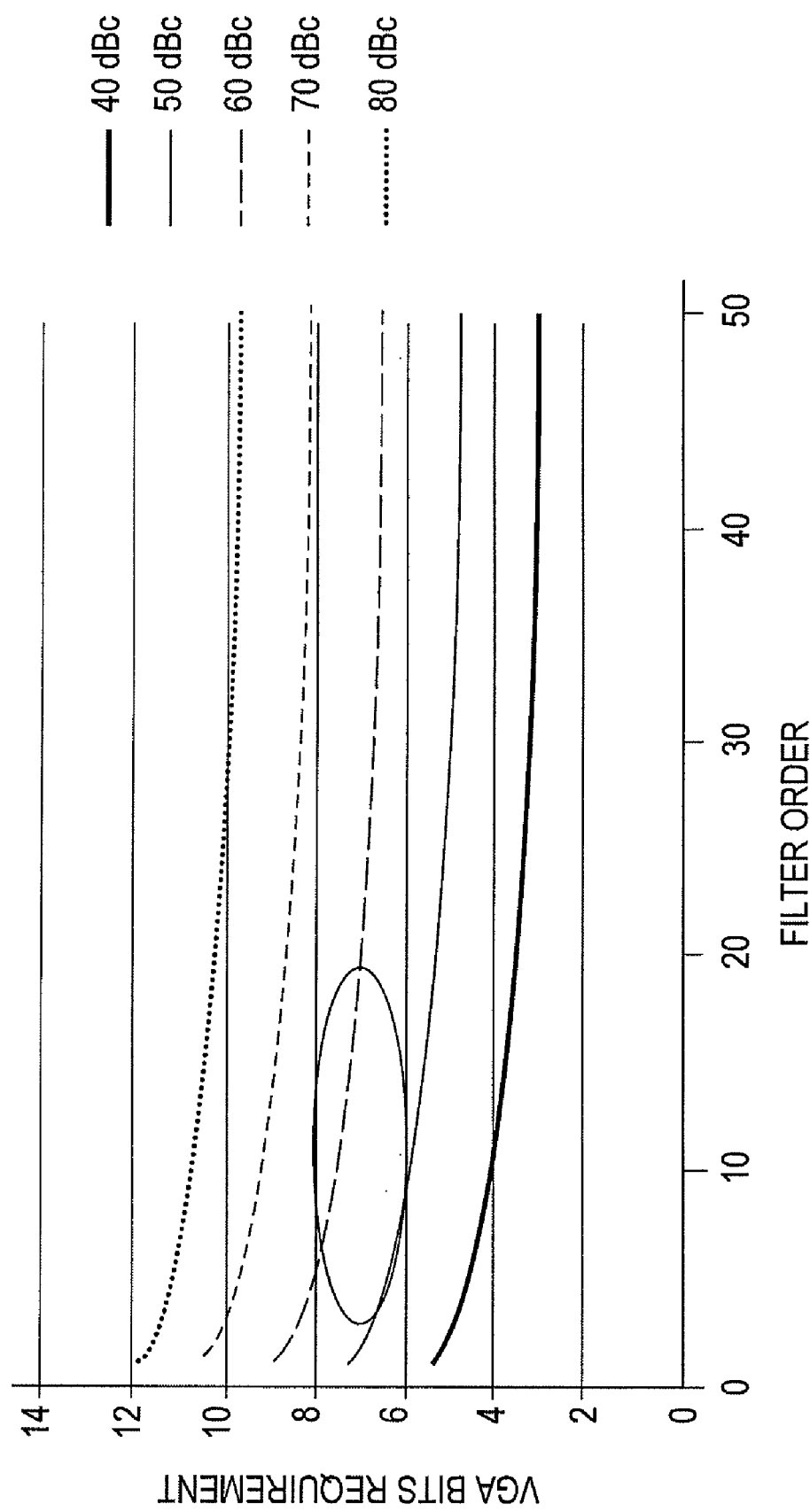
FIG. 16 shows a corresponding plot of VGA bits plotted vs. filer order.

Part II—Selected Examples of Suitable Integrated Structures:

FIG. 14a shows diagram of an exemplary VGA cell. As shown in FIG. 14a, a VGA can be configured by controlling the bias voltage of an amplifier. A digitally configurable VGA can be created using a semiconductor switch, such as is represented by the switch labeled BIT0 in FIG. 14a. If BIT0 is set to ONE at all time, we can tune the amplifier gain by tuning the vbias. However, in most of the present implementations, it can be preferable to digitally control each VGA (due to noise and speed considerations), therefore vbias can be made constant, while we use the BIT0 switch to turn on or off a particular gain cell. FIG. 14b shows diagram of an exemplary 3 bit VGA using the unit cell of FIG. 14a. By adding scaled versions of the gain cell of FIG. 14a (one cell for BIT0, two cells for BIT1, four cells for BIT2 . . . and so on), we can build a digitally control VGA, such as the example of a 3-bit VGA as shown in FIG. 14b. There are many other VGA circuits known in the art which are suitable for use in the inventive continuous FIR filter topology. Where a VGA is used, one design consideration is to provide a sufficient number of VGA bits suitable for a desired filter order. FIG. 15 shows FIR filter response as related to quantization noise with N-bit VGAs. FIG. 16 shows a corresponding plot of VGA bits plotted vs. filer order.

Figure 17:
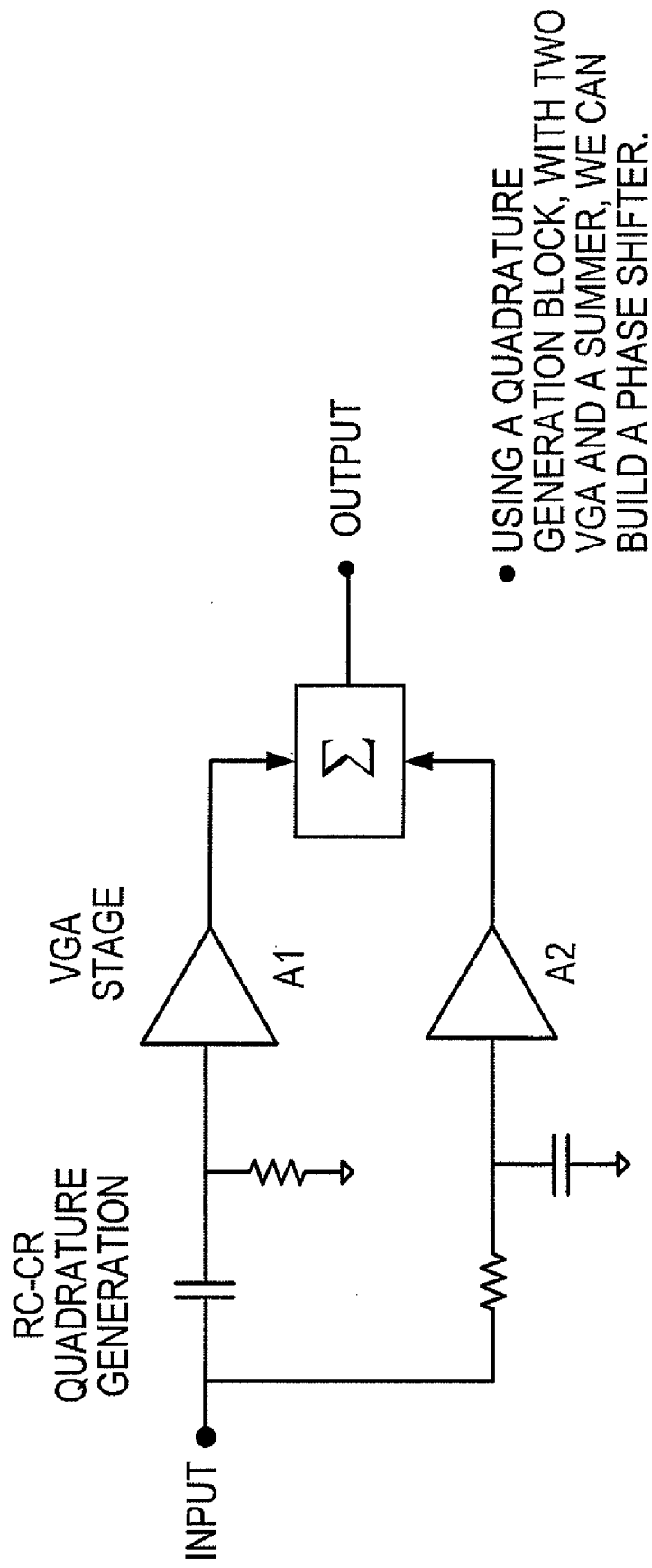
FIG. 17 shows an exemplary phase shifter.
Figure 18:
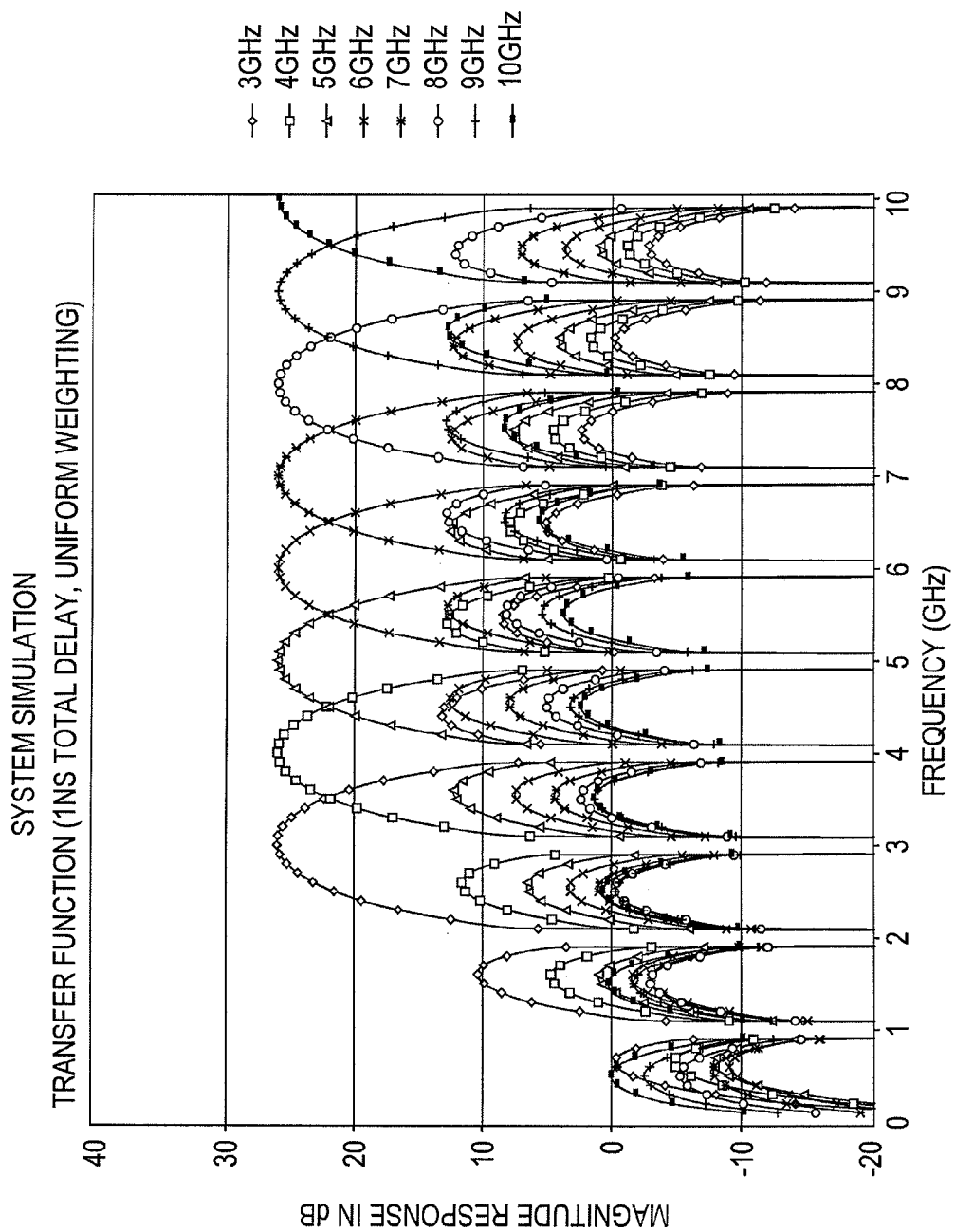
FIG. 18 shows a system simulation of a filter according to the invention using the phase shifter of FIG. 17.

FIG. 17 shows an exemplary phase shifter suitable for use in the inventive continuous FIR filter. There are many ways presently known in the art to build phase shifters. One embodiment of a phase shifter suitable for use in our inventive continuous filter is shown in FIG. 17. A RC-CR passive network generates a rough quadrature signal from the input signal. For a slightly more sophisticated use, two additional VGAs can further add a weight to each of the two quadrature signals, and a summer can be used to sum and outputs a phase shifted signal. FIG. 18 shows a system simulation of a filter according to the invention using the phase shifter of FIG. 17.

There are many other phase shifter circuits known in the art which are suitable for use in the inventive continuous FIR filter topology.

Figure 19:
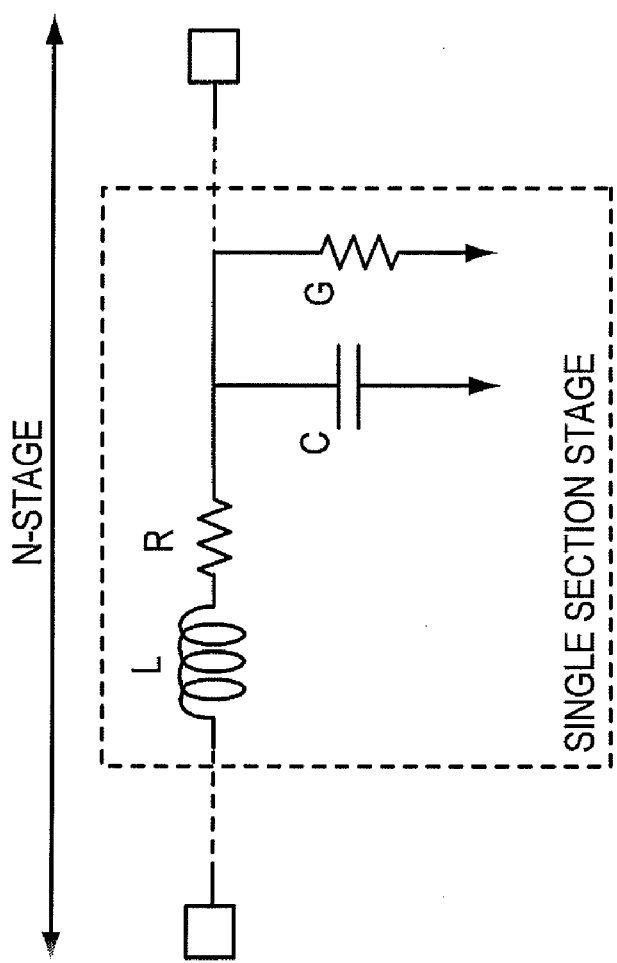
FIG. 19 shows a basic stage of a delay line (transmission line) suitable for use in a continuous filter.
Figure 20:
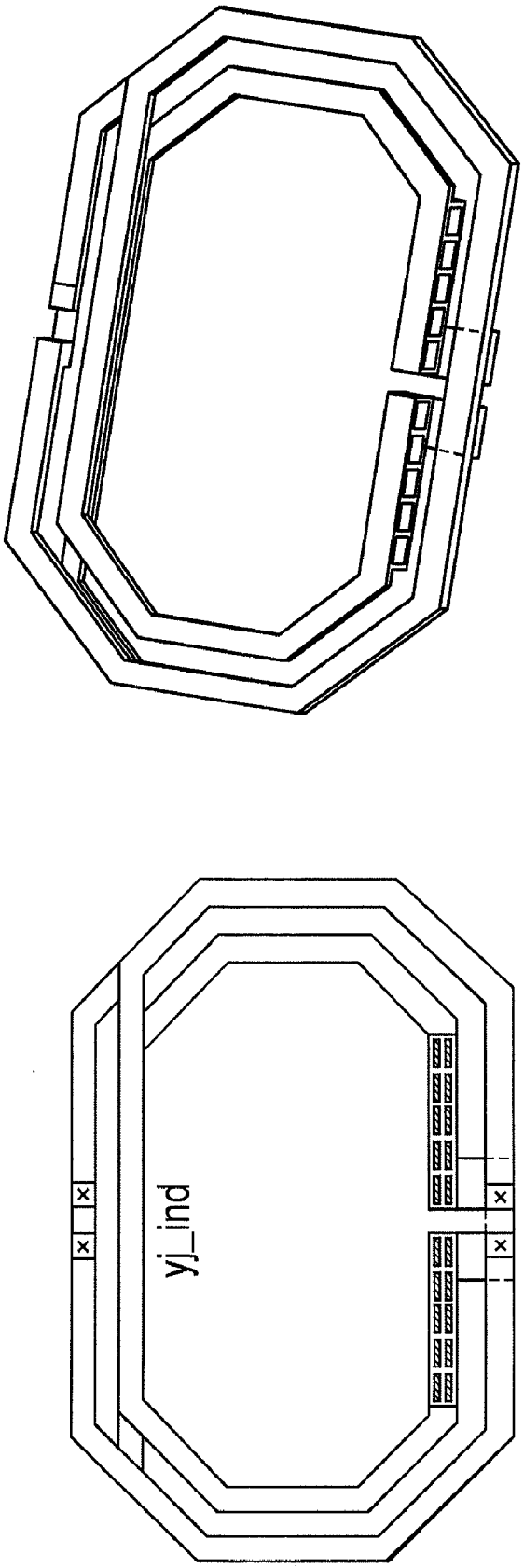
FIG. 20 shows an inductor design suitable for use in a delay line of a continuous FIR filter.

FIG. 19 shows a basic stage of a delay line (transmission line) suitable for use in a continuous filter. Integrated layout of the inductor element was found to be a factor in creating optimized delay lines, especially since the sectional size of the inductor is limited by the cutoff frequency. We found that considering the ratios of sectional loss to sectional group delay as well as the ratio of group delay to length that a rectangular shaped inductor was preferable for our delay line application. After simulating some 200 inductor shapes, we chose the rectangular differential inductor shown in FIG. 20 as an inductor design somewhat optimized for use in a continuous FIR filter.

Figure 21:
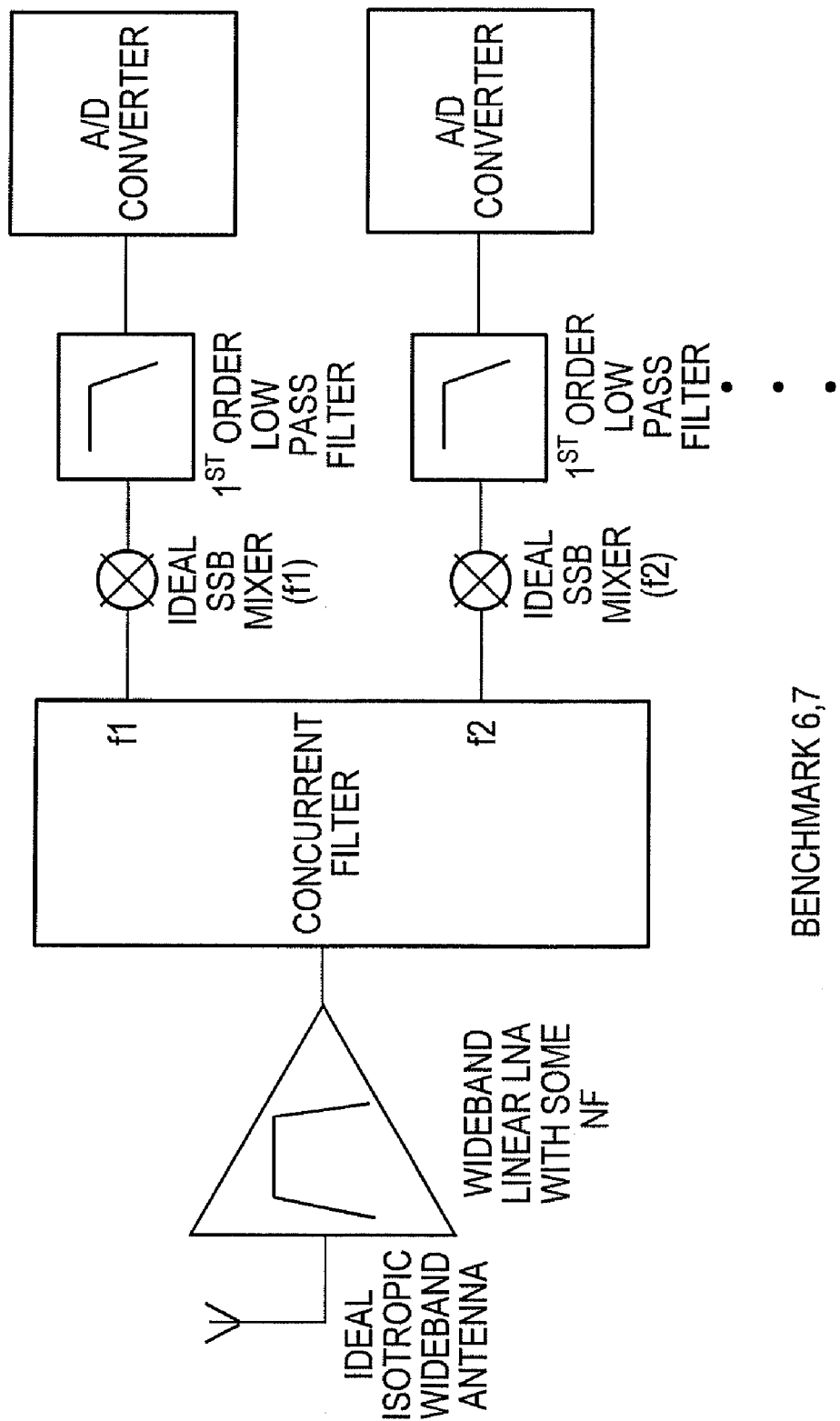
FIG. 21 shows a block diagram of an exemplary concurrent electromagnetic wave receiver using the inventive continuous FIR filter.
Figure 22:
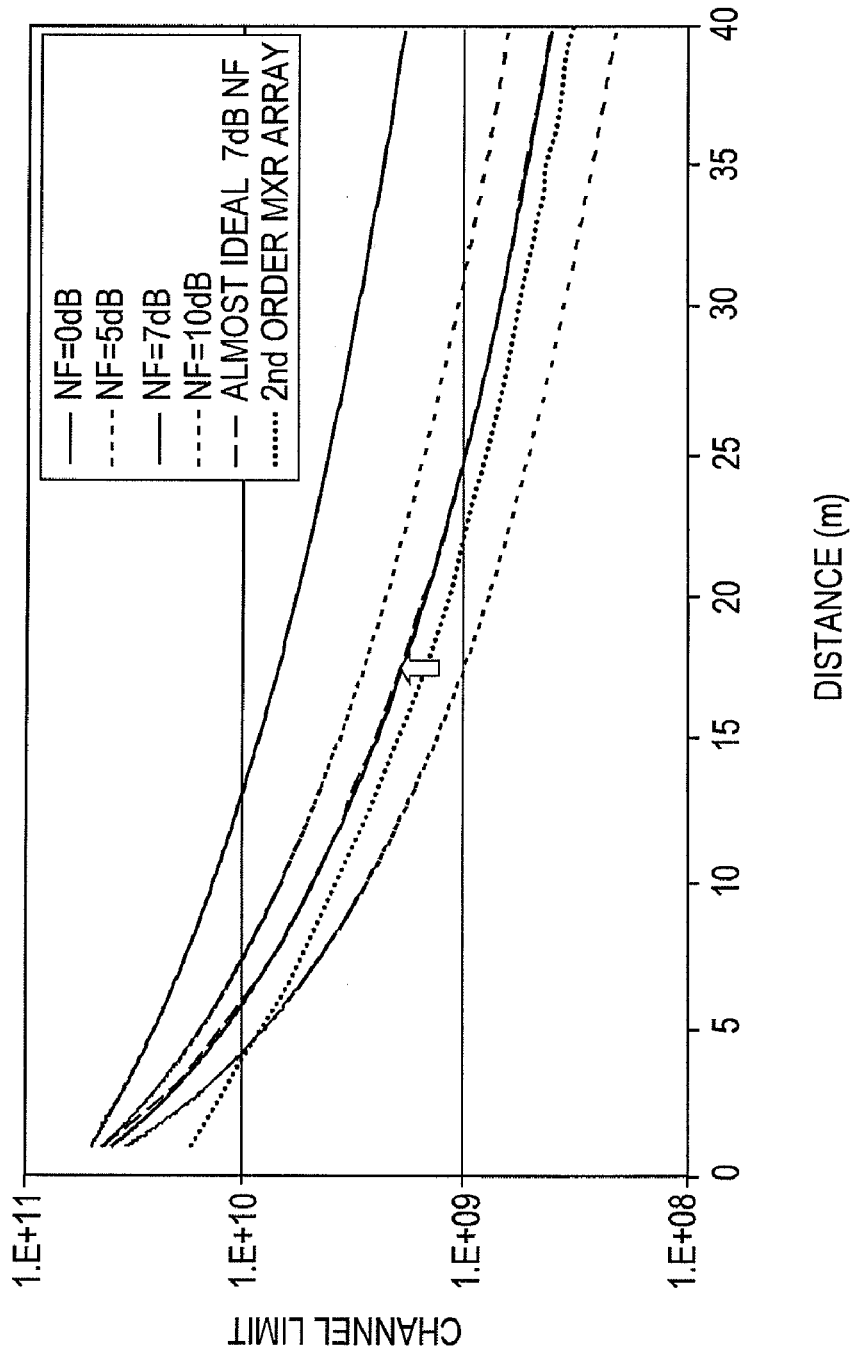
FIG. 22 shows a performance benchmark for the receiver of FIG. 21 in terms of available channel limit vs. distance from an electromagnetic source.
Figure 23:
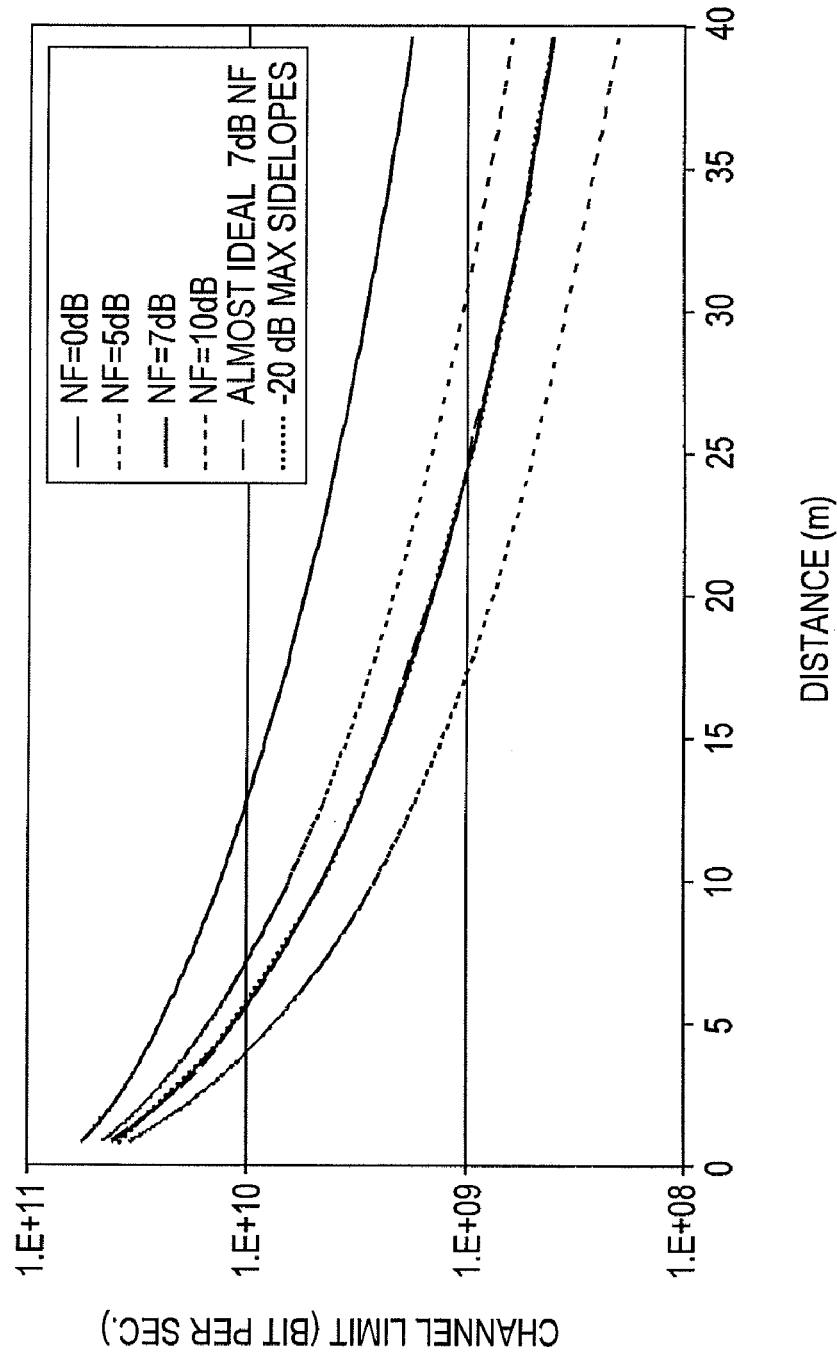
FIG. 23 shows a performance benchmark of channel speed limits vs. distance from an electromagnetic source.

Part III—An Exemplary Concurrent Electromagnetic Receiver Using the Inventive Continuous Fir Filter:

FIG. 21 shows a block diagram of one embodiment of an exemplary concurrent electromagnetic wave receiver using the inventive continuous FIR filter topology described herein. FIG. 22 shows a performance benchmark for the receiver of FIG. 21 in terms of available channel limit vs. distance from an electromagnetic source. FIG. 23 shows a performance benchmark of channel speed limits vs. distance from an electromagnetic source.

Figure 24:
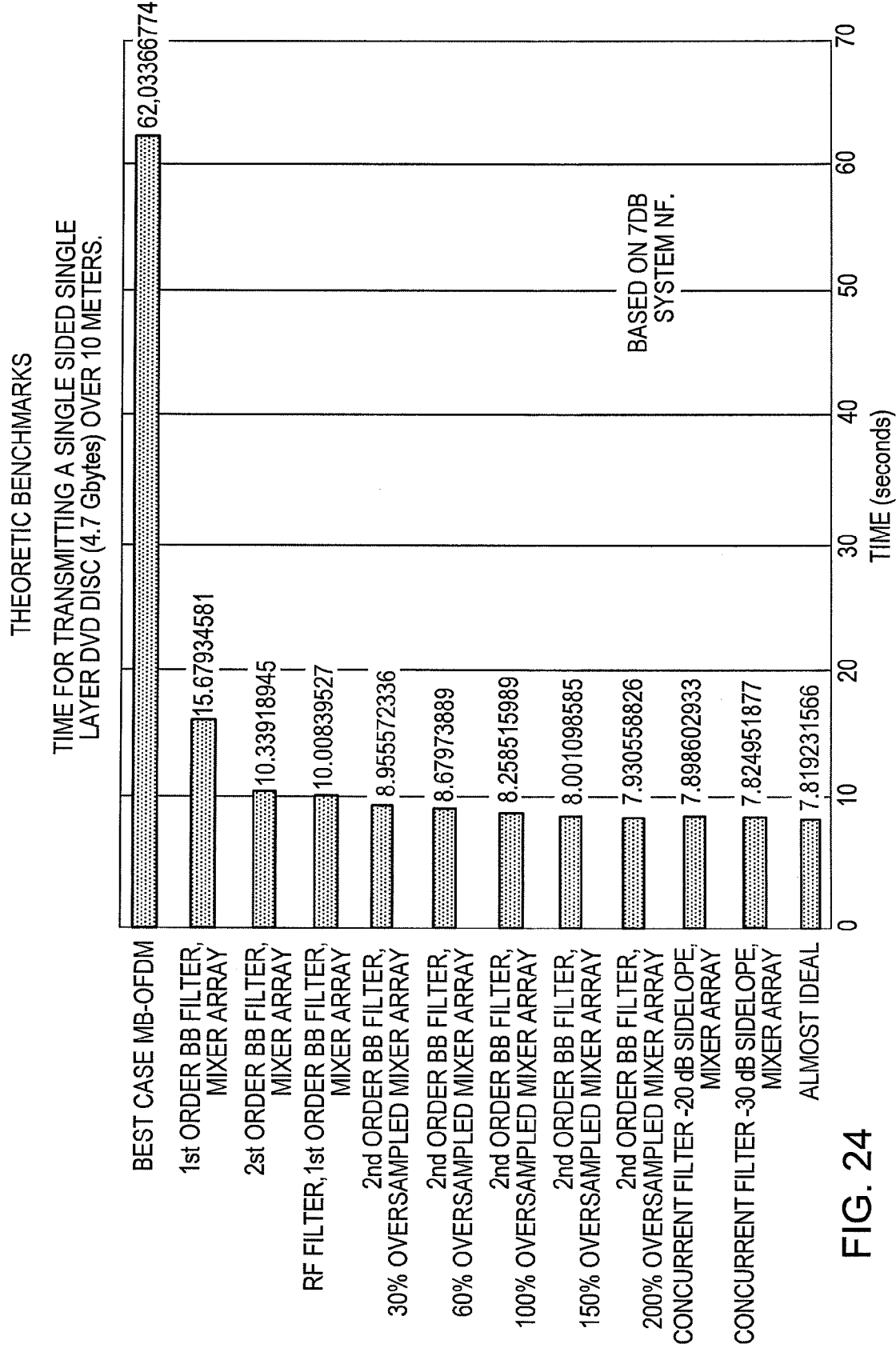
FIG. 24 shows benchmarks in terms of transmitting a single sided single layer DVD over a distance of 10 meters.
Figure 25:
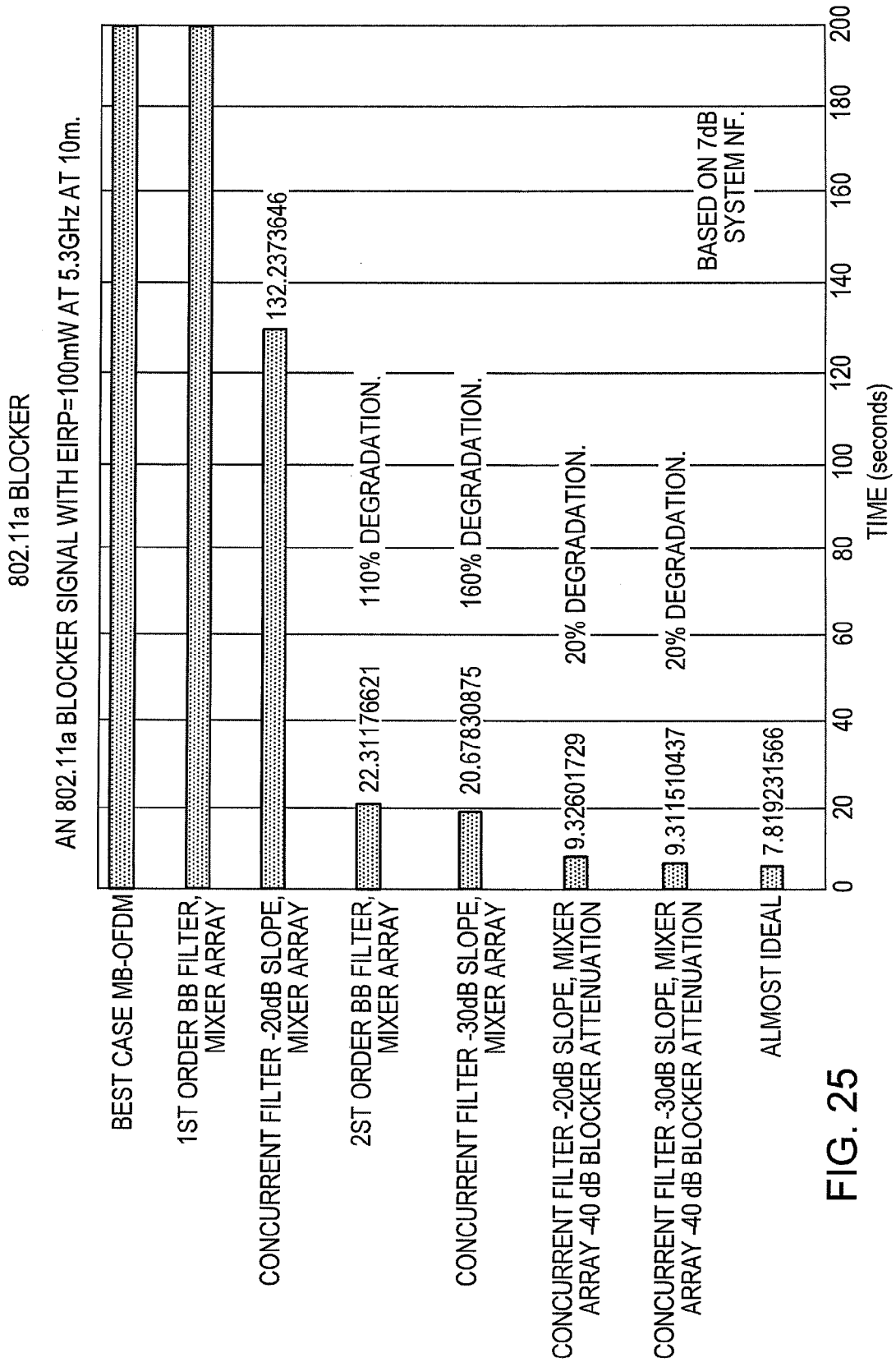
FIG. 25 shows the superior rejection performance of a concurrent filter in the presence of an 802.11a interfering signal (blocker).

FIG. 24 shows benchmarks in terms of transmitting a single sided single layer DVD over a distance of 10 meters. The benchmarks of FIG. 24 show in general terms that receivers using concurrent filters according to the invention can achieve higher transmission speeds than competing technologies and topologies. FIG. 25 shows the superior rejection performance of a concurrent filter in the presence of an 802.11a interfering signal (blocker). We have concluded from these benchmarks that the use of concurrent filters in concurrent receivers does improve transmission speed, albeit not in a linear manner. While adjacent channel interference can still be problematic, use of at least a second order concurrent filter should be helpful. Also, while blocker signals remain potentially problematic, with 40 dB of attenuation, we can effectively deal with an 802.11a interferer at 10 m.

Beyond the simulations, tests, and performance benchmarks discussed above, we contemplate several general embodiments of electromagnetic wave receivers using the inventive reconfigurable continuous FIR filters as described herein.

One particularly interesting receiver topology achieves channel concurrency to first order not by scaling the filter hardware, but rather through time division multiplexing. For example, a time multiplexed multiple frequency electromagnetic wave receiver can include a front end including a reconfigurable real time tunable continuous FIR filter according to the invention. Such a receiver can as needed, further include a low noise amplifier ("LNA") following a source of received electromagnetic radiation, such as from a radio antenna. A reconfigurable real time tunable continuous FIR filter having a filter output terminal can be in electrical communication with a down-converter. There can then be a plurality of application circuits in electrical communication with the down-converter output. Each application circuit can be configured to perform a selected application during a selected time multiplexed interval. Typical applications that can be performed by such a time multiplexed receiver include, but are not limited to, cellular telephone, GPS, wireless LAN, WiFi, WiMax, and Bluetooth applications. While a basic unit of a time-multiplexed receiver as so described performs concurrent applications using one time-multiplexed reconfigurable filter section (by reconfiguring the filter at each time interval), there is no limit to building parallel time multiplexed receivers to achieve yet a higher number of useful channels.

Another approach is a receiver topology that can achieve channel concurrency by employing the scalability aspect of the inventive filter topology. For example, a parallel channel multiple frequency electromagnetic wave receiver, is contemplated that uses a down-converter as described above, such as the exemplary down converters shown in FIG. 10, FIG. 12a, 12b, 13a, or 13b. The down-converter can be configured to receive a broad band electromagnetic wave signal, such as from a low noise amplifier ("LNA") and have a plurality of output terminals. Each of the plurality of application circuits can be in electrical communication with a selected one of the down-converter output terminals. Thus, each of the plurality of application circuits can be configured to receive a frequency band configured to support a selected one of the plurality of applications. The applications can include, but are not limited to, cellular telephone, GPS, wireless LAN, WiFi, WiMax, and Bluetooth applications.

Figure 26:
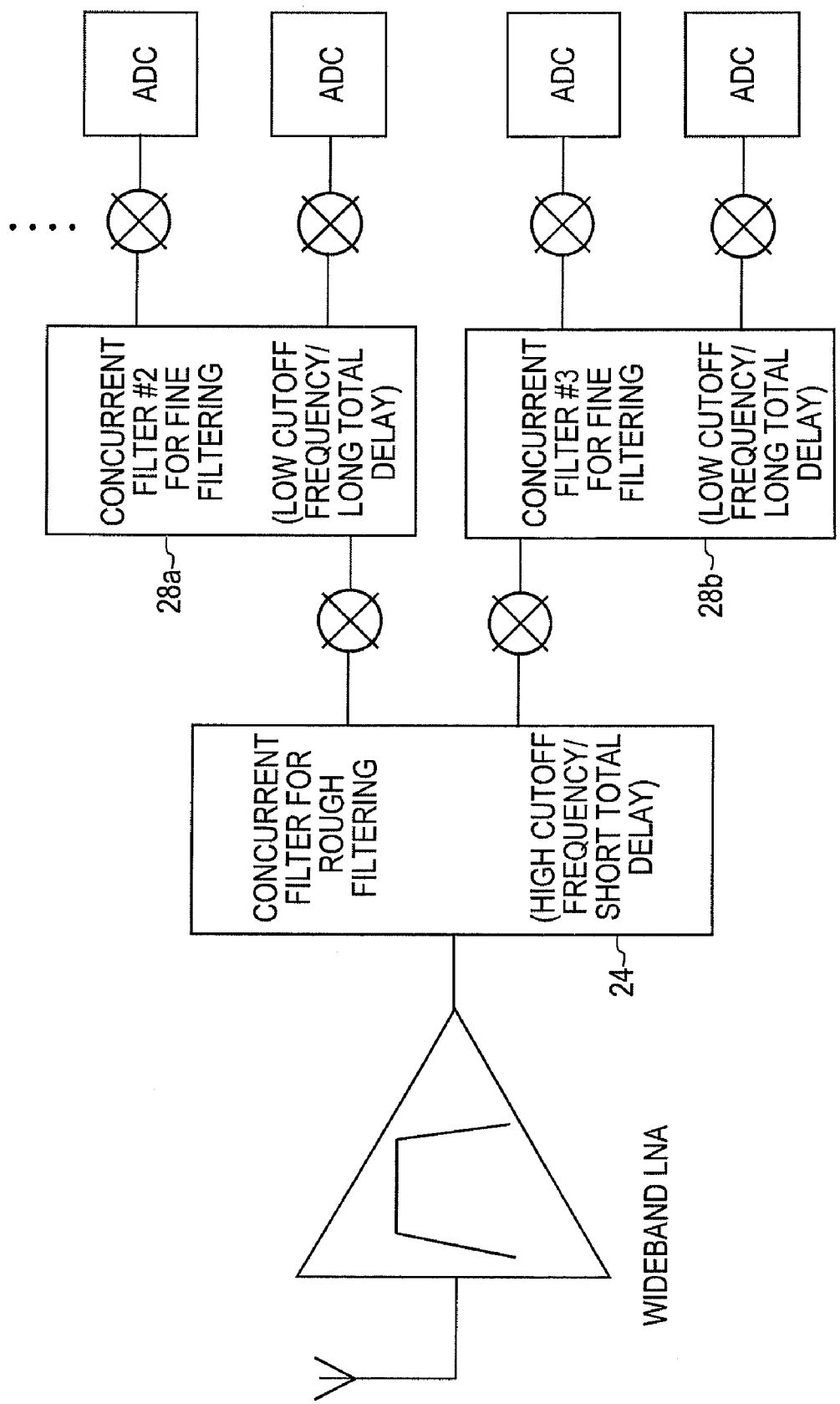
FIG. 26 shows a symbolic block diagram representation of an exemplary concurrent electromagnetic wave receiver using the "divide and conquer" method of FIG. 10.

FIG. 26 shows a symbolic block diagram representation of an exemplary concurrent electromagnetic wave receiver as described above. In FIG. 26, a down converter comprising concurrent filters 24, 28a, and 28b uses a down converter of the type previously described with respect to FIG. 10 as the "divide and conquer" method. As discussed above, local oscillator source(s) and mixer LO inputs have been omitted for simplicity.

Figure 27:
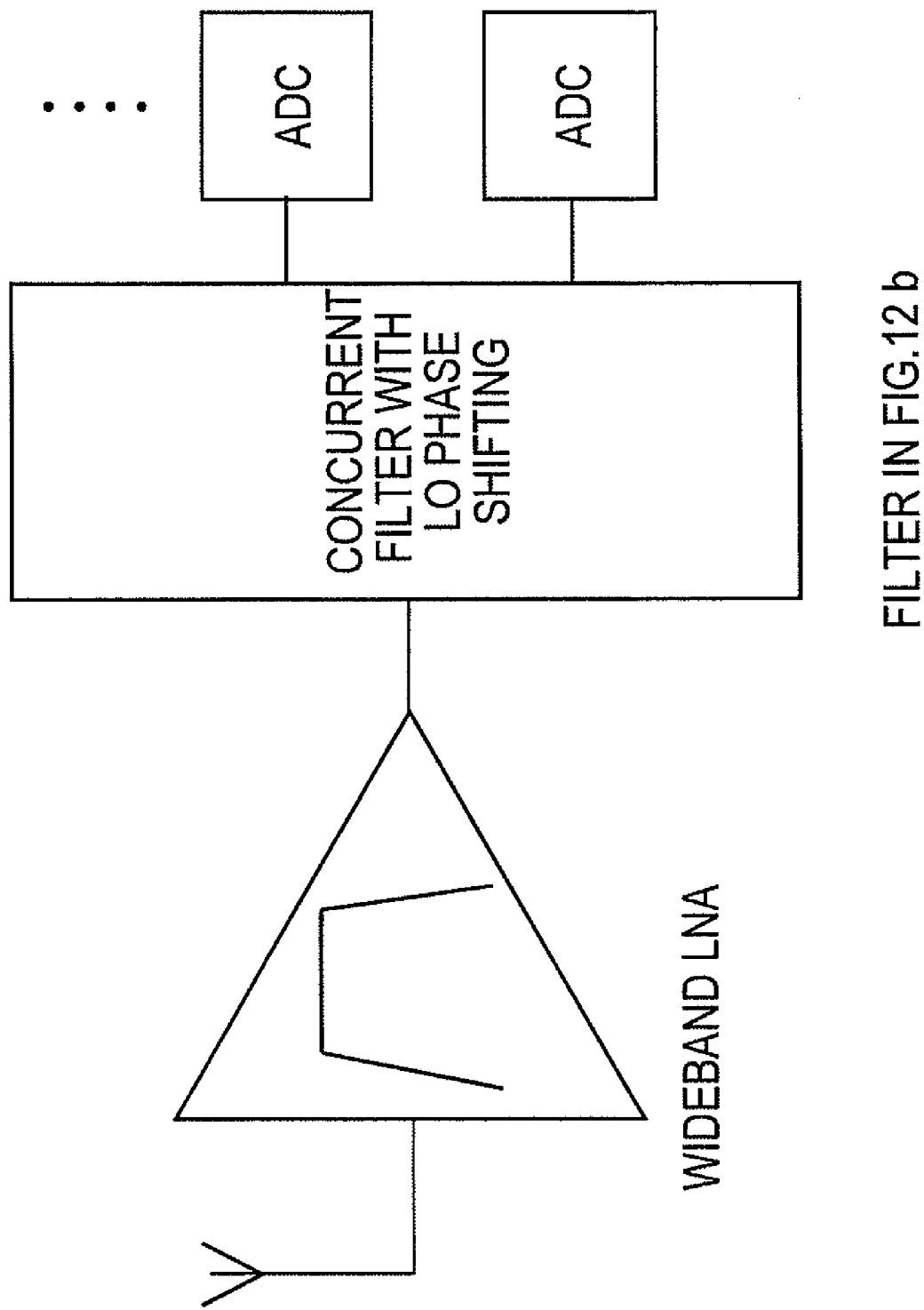
FIG. 27 shows a symbolic block diagram representation of an exemplary concurrent electromagnetic wave receiver using a combined filter/mixer of the type shown in FIG. 12b and FIG. 13b.

FIG. 27 shows a symbolic block diagram representation of an exemplary concurrent electromagnetic wave receiver as described above using a combined filter/mixer embodiment of the concurrent filter as shown in FIG. 12b and FIG. 13b.

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A reconfigurable continuous FIR filter, comprising:
an input terminal configured to accept as input a continuous signal to be filtered, and a first output terminal configured to provide as output a first filtered signal;
a delay line including at least two delay elements coupled in cascade and disposed between and in electrical communication with said input terminal and a delay line termination node; said delay line including at least one node situated between successive delay elements coupled in cascade; and
a filter section comprising:
at least three gain-phase elements having a respective first terminal and a respective second terminal, each of said at least three gain-phase elements having said respective first terminal coupled to a selected one of said filter input terminal, said at least one node situated between successive delay elements coupled in cascade, and said delay line termination node, at least one of said at least three gain-phase elements configurable in real time; and
a summing circuit having a plurality of inputs at least equal in number to said at least three gain-phase elements and having one output, a respective one of said plurality of inputs coupled to a respective second terminal of one of said at least three gain-phase elements, said summing circuit output coupled to said first output terminal;

wherein said reconfigurable continuous FIR filter is configured to exhibit a filter transfer function that is reconfigurable in real time between said input terminal and said first output terminal.

2. The reconfigurable continuous FIR filter of claim 1, wherein said filter transfer function that is reconfigurable in real time comprises at least one passband situated between at least two null frequencies.

3. The reconfigurable continuous FIR filter of claim 1, wherein said reconfigurable filter is reconfigured in response to a tuning signal applied to at least one of said gain-phase elements.

4. The reconfigurable continuous FIR filter of claim 1, further comprising:
at least one additional filter section according to claim 1, each of said at least one additional filter sections having a respective output terminal, each of said at least one additional filter sections coupled to said delay line as described in claim 1, each of said at least one additional filter sections configured to exhibit a reconfigurable filter transfer function that is reconfigurable in real time between said input terminal and said output terminal of said at least one additional filter section.

5. The reconfigurable continuous FIR filter of claim 1, wherein said at least three gain-phase elements comprise at least three substantially fixed gain real time configurable phase shifters.

6. The reconfigurable continuous FIR filter of claim 1, wherein said at least three gain-phase elements comprise at least three substantially fixed phase real time configurable variable gain amplifiers.

7. The reconfigurable continuous FIR filter of claim 1, wherein said at least three gain-phase elements are configured to have a frequency dependent phase characteristic.

8. The reconfigurable continuous FIR filter of claim 1, wherein said at least three gain-phase elements are configured to provide variable gain.

9. A reconfigurable electromagnetic wave down-converter, comprising:
a reconfigurable continuous FIR filter according to claim 4 having at least two output terminals; and
at least two mixers, each mixer having at least two respective input terminals and a respective output terminal, one input terminal of each mixer electrically coupled to a respective output terminal of said reconfigurable continuous FIR filter, and a second input terminal of each mixer electrically coupled to a second source of electromagnetic signals, each mixer configured to down-convert an output signal of said reconfigurable continuous FIR filter and configured to provide as output said down-converted signal at said respective output terminal of said mixer.

10. The reconfigurable electromagnetic wave down-converter of claim 9, further comprising in electrical communication with at least one output of said at least two mixers an additional reconfigurable continuous FIR filter.

11. The reconfigurable continuous FIR filter of claim 4, wherein each of said gain-phase elements further comprises a mixer.

12. The reconfigurable continuous FIR filter of claim 11, wherein each of said mixers further comprises a variable gain amplifier.

13. The reconfigurable continuous FIR filter of claim 11, further comprising in electrical communication with at least one output terminal an additional reconfigurable continuous FIR filter.

14. A time multiplexed multiple frequency electromagnetic wave receiver, comprising:
a front end comprising a reconfigurable real time tunable continuous FIR filter according to claim 1, said reconfigurable real time tunable continuous FIR filter having a filter output terminal;
a down-converter having a down-converter input in electrical communication with said filter output terminal, and having a down-converter output terminal; and
a plurality of application circuits in electrical communication with said down-converter output terminal, each application circuit configured to perform a selected application during a selected time multiplexed interval.

15. The time multiplexed multiple frequency electromagnetic wave receiver of claim 14, wherein each of said plurality of applications is a selected one of cellular telephone, GPS, wireless LAN, WiFi, WiMax, and Bluetooth.

16. A parallel channel multiple frequency electromagnetic wave receiver, comprising:
a down-converter according to claim 9, said down-converter configured to receive a broad band electromagnetic wave signal, and having a plurality of output terminals; and
a plurality of application circuits, each of said plurality of application circuits in electrical communication with a selected one of said down-converter output terminals, each of said plurality of application circuits configured to receive a frequency band configured to support a selected one of said plurality of applications.

17. The parallel channel multiple frequency electromagnetic wave receiver of claim 16, wherein each of said plurality of applications is a selected one of cellular telephone, GPS, wireless LAN, WiFi, WiMax, and Bluetooth.

18. A parallel channel multiple frequency electromagnetic wave receiver, comprising:
a reconfigurable continuous FIR filter according to claim 11, and having a plurality of output terminals; and
a plurality of application circuits, each of said plurality of application circuits in electrical communication with a selected one of said output terminals, each of said plurality of application circuits configured to receive a frequency band configured to support a selected one of said plurality of applications.

19. The parallel channel multiple frequency electromagnetic wave receiver of claim 18, wherein each of said plurality of applications is a selected one of cellular telephone, GPS, wireless LAN, WiFi, WiMax, and, Bluetooth.

20. A method for reconfigurable real time continuous filtering comprising the steps of:
(a) providing an input terminal configured to accept as input a continuous signal to be filtered, and an output terminal configured to provide as output a filtered signal;
(b) providing a delay line including at least two delay elements coupled in cascade and disposed between and in electrical communication with said input terminal and a delay line termination node; said delay line including at least one node situated between successive delay elements coupled in cascade;
(c) providing at least three gain-phase elements having a respective first terminal and a respective second terminal, each of said at least three gain-phase elements having said respective first terminal coupled to a selected one of said filter input, said at least one node situated between successive delay elements coupled in cascade, and said delay line termination node, at least one of said at least three gain-phase elements configured to be tunable in real time;

(d) providing a summing circuit having a plurality of inputs at least equal in number to said at least three gain-phase elements and one output, a respective one of said plurality of inputs coupled to a respective second terminal of one of said at least three gain-phase elements, said summing circuit output coupled to said filter output terminal;

(e) applying a broadband signal to said input terminal;

(f) configuring a transfer function of said by tuning at least one of said at least three gain-phase elements; and (g) delivering at said output terminal an output filtered signal in response to the application of said broadband signal to said input terminal 21. The method of claim 20, wherein step (c) comprises providing a plurality of structures each comprising said at least three gain-phase elements as recited in step (c) and wherein step (d) comprises providing a plurality of structures each comprising a summing circuit as recited in step (d), so as to provide a plurality of filter sections.

22. The method of claim 20, further comprising repeatedly performing steps (f) and (g) in time intervals to deliver a plurality of time division multiplexed filtered signals at said output terminal.

* * * * *

UNITED STATES PATENT AND TRADEMARK OFFICE
CERTIFICATE OF CORRECTION

PATENT NO. : 8,208,527 B2  
APPLICATION NO. : 12/022624  
DATED : June 26, 2012  
INVENTOR(S) : Yu-Jiu Wang et al.

Page 1 of 1

It is certified that error appears in the above-identified patent and that said Letters Patent is hereby corrected as shown below:

The STATEMENT REGARDING FEDERALLY FUNDED RESEARCH OR DEVELOPMENT appearing at column 1, lines 16-20 is deleted and is replaced with:

This invention was made with government support under Grant No. N00014-04-C-0588 awarded by the Office of Naval Research. The government has certain rights in the invention.

Signed and Sealed this  
Seventh Day of August, 2012

David J. Kappos  
*Director of the United States Patent and Trademark Office*